United States Patent [19]
Tatsuoka

[11] Patent Number: 5,855,011
[45] Date of Patent: Dec. 29, 1998

[54] METHOD FOR CLASSIFYING TEST SUBJECTS IN KNOWLEDGE AND FUNCTIONALITY STATES

[76] Inventor: Curtis M. Tatsuoka, 21 Crown Rd., Trenton, N.J. 08638

[21] Appl. No.: 712,110

[22] Filed: Sep. 13, 1996

[51] Int. Cl.⁶ .................................................. G06F 15/18
[52] U.S. Cl. ............................................. 706/45; 706/52
[58] Field of Search ..................................... 382/224, 228; 395/75, 76, 77, 51, 61, 927; 434/118

[56] References Cited

U.S. PATENT DOCUMENTS

| | | | |
|---|---|---|---|
| 5,193,144 | 3/1993 | Tsutsumi et al. | 395/76 |
| 5,245,698 | 9/1993 | Matsunaga | 395/61 |
| 5,305,425 | 4/1994 | Ishida et al. | 395/76 |
| 5,458,493 | 10/1995 | Clark et al. | 434/118 |
| 5,479,580 | 12/1995 | Kinoshita | 395/51 |
| 5,692,906 | 12/1997 | Corder | 434/118 |
| 5,696,884 | 12/1997 | Heckerman et al. | 395/77 |

OTHER PUBLICATIONS

D.P. Connors and P.R. Kurmar, "Simulated–Annealing Type Markov Chains and their Order Balance Equations," Proc. 27th Conf. on Decision and Control, pp. 1496–1501. Dec. 1988.

K.V. Le and V.O.K. Li, "Efficient Enumeration of Most Probable States for Systems with Dependent Failures and Multimode Components," Global Telecommunications Conf., vol. 2, pp. 693–697. Dec. 1990.

M.B. Clausing and T. Sudkamp, "Iterative, Probabilistic Classification Using Uncertain Information," Proc. IEEE 1991 National Aerospace and Electronics Conference, vol. 3, pp. 1144–1150. May 1991.

S. Lee and S. Shimoji, "BAYESNET: Bayesian Classification Network Based on Biased Random Competition Using Gausian Kernals," 1993 IEEE Int'l. Conf. on Neural Networks, vol 3, pp. 1354–1359. Apr. 1993.

R.E. Bryant and C.–J.H. Seger, "Digital Circuit Verification using Partially–Ordered State Models," Proc. 24th Int'l. Symp. on Multi–Valued Logic, pp. 2–7. May 1994.

P. Larranaga, et al., "Learning Bayesian Network Structures by Searching for the Best Ordering with Genetic Algorithms," IEEE Trans. on Systems, Man, and Cybernetics, vol. 26, No. 4, pp. 487–493. Jul. 1996.

Falmagne et al., "Introduction to Knowledge Spaces: How to Build, Test, & Search Them", Psych. Rev. 1990, vol. 97, No. 2, 201–24.

Villano et al., "Stochastic Procedures for Assessing An Individual's State of Knowledge", Proc. of the Int. Conf. on Comp–Assisted Learning . . . , 369–371, Univ. of Calgary, Calgary, Alberta, Canada, 1987.

*Primary Examiner*—Robert W. Downs
*Attorney, Agent, or Firm*—Robert E. Malm

[57] ABSTRACT

A method for classifying a test subject in one of a plurality of states in a domain, a domain being a set of facts, a quality measure, or a combination of the two. The set of facts for a knowledge domain is any set of facts while the set of facts for a functionality domain is a set of facts relating to the functionality of a test subject. A state is characterized by a subset of facts, a value for a quality measure, or a combination of a subset of facts and a value for a quality measure. A first state is higher than or equal to a second state and a second state is lower than or equal to a first state if (1) the subset of facts or the quality measure value associated with the first state respectively includes the subset of facts or is greater than or equal to the quality measure value associated with the second state or (2) the subset of facts and the quality measure value associated with the first state respectively includes the subset of facts and is greater than or equal to the quality measure value associated with the second state. Decision-theoretic rules are specified for selecting the test items to be administered to a test subject, for determining when it is appropriate to stop administering test items, and for determining the classification of the test subject. A test subject is classified in the highest state of which he has the knowledge or functionality.

101 Claims, 4 Drawing Sheets

METHOD FOR CLASSIFYING TEST SUBJECTS IN KNOWLEDGE AND FUNCTIONALITY STATES

BACKGROUND OF THE INVENTION

This invention relates generally to methods and systems for testing humans and systems and the subsequent classification of humans into knowledge states and systems into functionality states. More specifically, the invention relates to computer-implemented testing and classification systems.

The process of testing and classification requires meaningful and accurate representations of the subject domain in terms of domain states. The domain state that a test subject is in is determined by sequentially administering to the test subject test items involving different aspects of the subject domain. The responses of the test subject to the test items determines the state of the test subject in the subject domain.

The implementation of such a testing and classification process by means of a computer has the potential of providing an efficient and effective means for identifying the remedial actions required to bring the test subject to a higher level of knowledge or functionality.

The partially ordered set ("poset") is a natural model for the cognitive and functionality domains. Two states i and j in a poset model S may be related to each other in the following manner. If a test subject in state i can respond positively to all the test items to which a test subject in state j can but a test subject in state j may not be able to respond positively to all the test items to which a test subject in state i can, we say that i contains j and denote this by the expression $i \geq j$. Note that a positive response on any item should provide at least as much evidence for the test subject being in state i as in state j. Thus, the domain states are partially ordered by the binary "i contains j" relation. Note that the cognitive level or the functionality level of a test subject in state i is equal to or higher than that of a test subject in state j. Similarly, the cognitive level or the functionality level of a test subject in state j is equal to or lower than that of a test subject in state i. Accordingly, state i is said to be equal to or higher than state j and state j is said to be equal to or lower than state i.

Poset models in an educational context have been proposed before. However, they have either been Boolean lattices or posets closed under union in the sense that the union of any two members of the poset is also in the poset. This restriction is undesirable in that it leads to models that can be quite large. For example, allowing the number of test items to define the model can lead to models with as many as $2^N$ possible states where N is equal to the number of test items. With this approach the responses to the test items permits immediate classification with very little analysis. However, having such overly large models ultimately results in poor classification performance.

When sequential item selection rules have been used in classifying states in a poset, the approach has not been accomplished in a decision-theoretic context. Consequently, there was no assurance that the classification process would converge rapidly nor, in fact, that it would converge at all.

There is a need for a testing and classification system which is based on sound scientific and mathematical principles and which, as a result, can accurately and efficiently determine the domain states of humans and systems. It is reasonable to base such a system on poset models, but it should be possible to use general, even non-finite posets rather than the specialized posets that are typical of present-day systems. It is important that model selection and fitting for any particular domain be based on appropriate analysis rather than simply a result of the choice of test items. Similarly, the selection of test items should be based on appropriate analysis with reference to the domain model rather than being a more-or-less ad hoc process that ultimately gives birth to its own domain model.

SUMMARY OF THE INVENTION

The invention is a method for classifying a test subject in one of a plurality of states in a domain, a domain being a set of facts, a quality measure having a range of values, or a combination of a set of facts and a quality measure. The set of facts for a knowledge domain is any set of facts while the set of facts for a functionality domain is a set of facts relating to the functionality of a test subject. A state is characterized by a subset of facts, a value in the range of values for a quality measure, or a combination of a subset of facts and a value for a quality measure. A first state is higher than or equal to a second state and a second state is lower than or equal to a first state if (1) the subset of facts or the quality measure value associated with the first state respectively includes the subset of facts or is greater than or equal to the quality measure value associated with the second state or (2) the subset of facts and the quality measure value associated with the first state respectively includes the subset of facts and is greater than or equal to the quality measure value associated with the second state. A test subject is classified in the highest state of which he has the knowledge or functionality.

The first step of the method consists of specifying a domain comprising a plurality of states and determining the higher-lower-neither relationships for each state, the higher-lower-neither relationships being a specification of which states are higher, which states are lower, and which states are neither higher nor lower. The plurality of states includes a first, second, and third fact state characterized by subsets of facts wherein (1) the first and second fact states are higher than the third fact state and the first fact state is neither higher nor lower than the second fact state or (2) the first fact state is higher than the second and third fact states and the second fact state is neither higher nor lower than the third fact state.

The second step of the method consists of specifying a test item pool comprising a plurality of test items pertaining to a particular domain.

The third step of the method consists of specifying an initial state probability set (SPS) for the test subject to be classified, each member of the initial SPS being an initial estimate of the probability density value that the test subject is associated with a particular state in the domain.

The fourth step of the method consists of specifying a class conditional density for each test item in the test item pool for each state in the domain, a class conditional density being a specification of the probability of a test subject in a given state providing a particular response to a specified test item. Each test item partitions the domain of states into a plurality of partitions according to the class conditional densities associated with the item, a partition being a subset of states for which the class conditional densities are the same or the union of such subsets.

The final steps of the method are administering one of a sequence of test items from the test item pool to a test subject and, after receiving a response to an administered test item, updating the SPS and determining whether to stop the administering of test items and classify the test subject.

Decision-theoretic rules are specified for selecting the test items to be administered to a test subject, for determining when it is appropriate to stop administering test items, and for determining the classification of the test subject.

DESCRIPTION OF THE PREFERRED EMBODIMENTS

The first objective of the present invention is to provide meaningful and accurate representations of a cognitive domain in the case of humans and a functionality domain in the case of systems (where "systems" includes humans considered as systems) through the use of partially ordered sets (posets). The second objective of the present invention is to provide a method for efficiently and accurately testing and classifying humans into cognitive domain states and systems into functionality domain states. The third objective is to provide a remediation program keyed to a domain state and designed to bring a human or a system to a higher domain state.

The classification process consists of administering a sequence of response-generating test items to the test subject. The responses to the test items provides the means for classifying the test subjects into particular domain states. In the case of humans, the test items might be questions or problems relating to particular subject matter such as arithmetic, chemistry, or language. In the case of a system, a test item might consist of (1) causing a system to be in a particular operating state and (2) causing certain inputs to be entered into the system, the response to be observed being the operating state of the system after the specified inputs have been entered into the system. The operating state and the functionality state of a system are two different concepts. For example, if the system is an aircraft, the operating state could be defined as its position and attitude and the time rate of change of its position and attitude. Its functionality state is a measure of the degree to which each of the functions that must be performed within the aircraft system to maintain it in an operating state are being performed.

The classification capability of the system provides the means for prescribing remedial programs aimed at propelling humans and systems into higher and higher states in their respective cognitive and functionality domains.

The poset models which provide the basis for the present invention may be either finite or non-finite. In many educational applications, it can be assumed that the poset is finite with top and bottom states denoted by 1 and 0 respectively, 1 denoting complete knowledge or functionality in a particular domain, and 0 denoting essentially no knowledge or functionality. However, this invention applies just as generally to poset models without a top and/or bottom state. For much of the material to follow, it will be assumed that the underlying model is a discrete poset. Later, a non-discrete poset model will be described.

Figure 1:
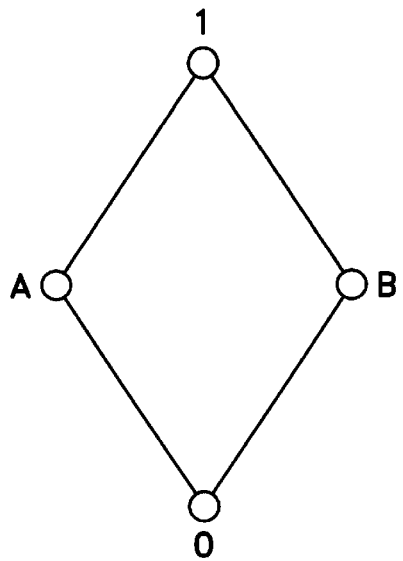
FIG. 1 depicts an example of a simple poset model as a Hasse diagram.

A formal definition of a partially ordered set and a partial order is as follows. Let P be a set with a binary relation $\leq$. P is said to be a partially ordered set, and the binary relation $\leq$ a partial order if for all elements i, j, and k in P the following conditions hold: $i \leq i$, $i \leq j$ and $j \leq i$ implies i=j, and $i \leq j$, $j \leq k$ implies $i \leq k$. an example of a poset is in FIG. 1, depicted as a Hasse diagram. Note $A \leq 1$, $B \leq 1$, $0 \leq A$, $0 \leq 1$, etc. If $i \nleq j$ and $j \nleq i$, i and j are said to be incomparable, and the relation "strict inequality" is said to occur on P when $i \leq j$ and $i \neq j$.

Associated with each test item and each domain state of a test subject is a class conditional density $f_i(x|s)$ which is the probability of a state-s test subject providing the response x to a test item i. For simplicity, test items are assumed to be conditionally independent in the sense that responses to previously administered items do not affect the response to a presently-administered item. It should be noted, however, that this assumption can be relaxed, and all the techniques to be described below can be applied to the case where the test items are not conditionally independent. Moreover, response x can be viewed as multi-dimensional without loss of generality.

For a properly structured poset model S and properly designed test items, a test item will partition S into subsets according to the class conditional densities associated with the test item. It will be assumed for now that a test item partition consists of the subsets of states which share the same class conditional density. In practice, an expert must initially specify the partitions according to how he believes the response distributions should be structured and possibly shared among states. Specification and/or estimation of the class conditional densities can then be conducted. (The estimation process will be described below.) Modification of the partitions is possible after feedback from data analysis, as will also be described below.

One of the subsets may be a principal dual order ideal (PDOI) generated by a state in S. The PDOI generated by a state s is the set of states $\{j \text{ in } S : s \leq j\}$, where $\leq$ denotes the partial order relation. A common partition for an item will have two elements, one being a PDOI, generated say by s in S. Under such circumstances, the test item is said to be of type s or associated with s. A test subject in the PDOI of state s is more likely to provide a response to a test item of type s that is consistent with the knowledge or functionality of state s than a test subject who is not.

More generally, reference to an item's type refers to its partition. Note that one of the partitions could be the union of PDOIs.

The system works best when the response distributions reflect the underlying order structure on the model S. This can be achieved for instance by imposing order constraints on item parameters associated with corresponding item partitions. For example, with Bernoulli response distributions, it maybe natural to assume $f_i(X=1|s_1) \leq f_i(X=1|s_2)$ for item i if $s_1 \leq s_2$ in S where X=1 implies a positive outcome where we use the term "positive" in the sense that the outcome is more consistent with the knowledge or functionality of state $s_2$ than that of state $s_1$. The system works most efficiently in applications when such order constraints on the class conditional response distributions are natural for the underlying poset model.

Clearly, each state may have its own response distribution for an item. However, in practice, this may present a difficult estimation problem such as having too many parameters. Hence, using the minimum number of natural partitions for an item is desirable for simplifying the density estimation process.

In the educational application with Bernoulli responses, a natural possible two-element partition for an item is the subset of states in S wherein test subjects have the knowledge or functionality to provide a positive response to the item and the complement of the subset. It is natural to assume that the probability of a positive response by test subjects in this subset of states to be greater than that for test subjects in the complement. Further, specifying one of the subsets as a union of PDOIs can reflect that there exists multiple strategies to obtain a positive response.

The partially ordered set structure of domain states permits great efficiency in classification of test subjects. For example, suppose the set S consists of the states 0, A, B, C, AB, AC, BC, ABC (=1) where the cognitive or functionality domain is divided into three areas A, B, and C. The symbol 0 denotes no knowledge or functionality. The symbols AB, AC, and BC denote knowledge or functionality equivalent to the unions of individual area pairs. And the symbol ABC denotes knowledge or functionality equivalent to the union of all of the individual areas. Assume the item distributions to be Bernoulli, with the probability of positive responses given that the test subject has the knowledge or functionality to provide a positive response to be 1, and the probability of a positive response given that he does not to be 0. Administering a test item of type A partitions the set S into the PDOI of A (i.e. A, AB, AC, ABC) and the complement (i.e. 0, B, C, BC). If the test subject gives a positive response, a test item of type B partitions the PDOI of A into the PDOI of B (i.e. B, AB, BC, ABC) and the complement (i.e. 0, A, C, AC). If the test subject again gives a positive response, we have narrowed down the possible states for the test subject as being the intersection of the PDOI of A and the PDOI of B or the set consisting of AB and ABC. If the test subject now gives a negative response (i.e. not a positive response) to a test item of type ABC, we have determined that the test subject should be classified in state AB. Thus, by administering only three test items, we have managed to uniquely classify a test subject into one of 8 possible states. In general, the classification process becomes more complex as the response distributions become more complex in the sense that there may exist a variety of possible responses, not all of which are statistically consistent with the true state identity.

The basis for the computer-implemented testing and classification process is a poset model S and a test item pool I. The statistical framework used to classify test subject responses is decision-theoretic. This entails selection of a loss function to gauge classification performance. In general, a loss function should incorporate a cost of misclassification and a cost of observation. For a given test subject, an initial state probability set (SPS at stage 0) is assigned as well, and denoted as $\pi_0$. The SPS at stage 0 consists of prior probabilities concerning the test subject's state membership in S, and there exists in the set for each state s in S a prior probability value $\pi_0(s)$. The decision-theoretic objective in classification is to minimize an integrated risk function.

There are three main issues in classification: item selection, deciding when to stop the item administration process, and making a decision on classification once stopping is invoked. We define a strategy $\delta$ to be the incorporation of an item selection rule, stopping rule, and decision rule. What is desired is to find strategies that minimize the integrated risk function $R(\pi_0,\delta)$ which will be defined later. For a description of the framework when S is finite, see J. Berger, *Statistical Decision Theory and Bayesian Analysis, Second Edition*, Springer-Verlag, New York, 1985, p. 357.

As mentioned earlier, loss functions should incorporate a cost of misclassification and a cost of observation. Whether a decision rule misclassifies depends on which state is true. Hence, the system assumes that loss functions depend on the true state s in S, a decision rule $d(x_n)$ which is a function of the response path $x_n$ of length n, and n, the number of observations. Note that $d(x_n)$ can be viewed as a function of the final SPS through $x_n$ and the initial SPS, $\pi_0$. A loss function may be denoted by $L(s,d,n)$ where d is the action that the decision rule $d(x_n)$ takes. Being a function of n includes the case where test items have their own cost of observation.

In order for a loss function to encourage reasonable classification, it will further be assumed that for fixed s in S and fixed number of observations n, when the decision rule takes an action that results in a misclassification, the value of a loss function will be greater than or equal to the value if the classification decision was correct. Similarly, for fixed s in S and fixed classification decision, the value of a loss function will be non-decreasing in n, the number of observations.

Besides serving as objective functions to measure the performance of the classification process, such loss functions are used in stopping rules, generating decision rules, and item selection.

Given a loss function and initial SPS, it is desired to find a strategy 67 which minimizes $$R(\pi_0, \delta) = \sum_{s \in S} \sum_{x_N} L(s, d(\underline{x_N}), N|\delta) f(\underline{x_N}|s) \pi_0(s) \qquad (1)$$

where $f(x_N|s)$ is the response distribution for possible response path $x_N$ of length N for a given state s in S, N is random and dependent on the response path, item sequence is selected by $\delta$ and the stopping rule is given by $\delta$, and the classification decision rule $d(x_N)$ is given by $\delta$. This quantity is known as the integrated risk of $\delta$ given the initial SPS. It is the criterion on which to base the performance of strategies in the classification process. If the possible responses are continuous, then one would integrate as opposed to sum over all possible response paths. When N=0, equation (1) gives the average loss with respect to the initial SPS.

A linear version of a loss function is given by the equation $$L(s, d, N) = \begin{cases} A_1(s) + \sum_{n=1}^{N} C(i_n); & d = s \\ A_2(s) + \sum_{n=1}^{N} C(i_n); & d \neq s \end{cases} \qquad (2)$$

where $L(s,d,N)$ is the loss function associated with the action of classifying in state d a test subject whose true state is s after administering test items $i_1, i_2, \ldots, i_N$. The constants $A_1(s)$ and $A_2(s)$ are the losses associated with correct and incorrect classifications respectively for state s being true. Assume $A_1(s) \leq A_2(s)$. This relation signifies that the loss associated with a correct assignment is always less than or equal to the loss associated with an incorrect one. The cost of administering a test item $C(i_n)$ suggests that the cost may be a function of the test item. For example, the complexity of items may vary and the cost of developing and administering the items may vary as a result. For simplicity, the cost of administering a test item can be assumed to be the same for all test items.

For purposes of discussion, let us assume that $C(i_n)=0.1$ (a constant) for all test items and that $A_1(s)=0$, $A_2(s)=1$ for all states s in S. Suppose at stage n, the largest posterior value in the SPS is 0.91. The optimal decision rule for this loss function in terms of minimizing the integrated risk given a response path and given that stopping has been invoked is to take the action of classifying to the state with the largest probability value in the final SPS. An optimal decision rule in terms of minimizing the integrated risk is referred to as the Bayes decision rule. With respect to this loss function and the corresponding integrated risk, it is not worth continuing since the reduction in average misclassification cost cannot possibly exceed the cost of taking another observation. If $C(i_n)$ were equal to 0 for all test items, it would presumably be worth continuing the administering of test items indefinitely in order to obtain higher and higher probabilities of a correct assignment since the cost of an incorrect assignment overpowers the nonexistent cost of administering test items. This example gives an indication of how the cost of observation plays a role in deciding when to stop, and how the cost of misclassification and cost of observation must be balanced.

The basis for the computer-implemented testing and classification process is a poset model S and a test item pool I that is stored in the computer memory.

Consider again the poset model in FIG. 1. For the cognitive domain of arithmetic, state A might represent a mastery of addition and subtraction, state B might represent a mastery of multiplication and division, and state 1 might represent a mastery of arithmetic, the union of states A and B. For the functionality domain of an AND gate, state A might represent the proper functioning of a NAND gate, state B might represent the proper functioning of an inverter which inverts the output of the NAND gate, and state 1 might represent the proper functioning of both the NAND gate and the inverter (i.e. the AND gate).

Figure 2:
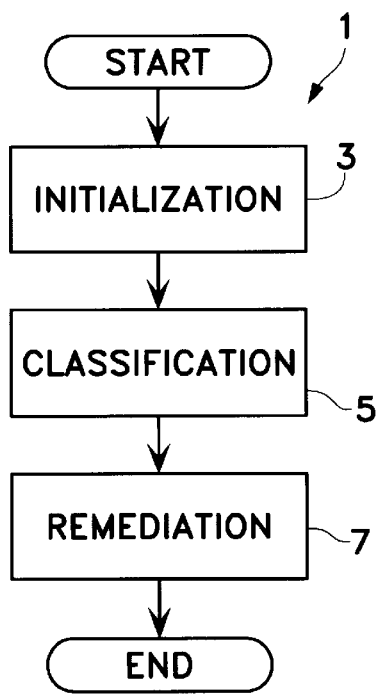
FIG. 2 shows a flow diagram for the process executed by a computer in classifying a test subject and providing remediation in the case of a human test subject or remediation guidance in the case of a system test subject.

The flow diagram 1 for the process executed by the computer in classifying a test subject and providing remediation in the case of a human test subject or remediation guidance in the case of a system test subject is shown in FIG. 2. The process begins with the initialization step 3 whereby the poset model, the test item pool, and the test subject's initial state probability set are stored in computer memory.

The poset model is defined by a list of states, the PDOI for each state, information about the costs of correct and incorrect classification for each state (given that the state is the true state of the test subject), and a forwarding address to a remediation program for each state.

A test item pool is a collection of test items. A test item pool is always linked to a particular poset model. Associated with each test item in the test item pool are class conditional densities. The expression $f_i(x_n|s)$ denotes the class conditional density associated with the n'th administered test item i, $x_n$ being one of the possible responses to the n'th test item given that the state s is the true state of the test subject.

The test subject's initial state probability set (SPS) includes a member for each state in the poset model and is denoted by $\pi_0$. The notation $\pi_0(s)$ denotes the probability value in the collection of probabilities $\pi_0(s)$ for the system's prior belief that the test subject belongs to state s, where s represents any one of the states. There are a number of possible choices for the test subject's initial SPS. One possibility is to assign a non-informative initial SPS which does not take into account subjective information about the test subject and thus treats all test subjects the same. An example of such an initial SPS is a uniform set in which all of the probabilities are equal. This choice is attractive in that there is no need for prior information about the test subject. Another example of a non-informative initial SPS is one in which the probabilities are derived from the distribution of prior test subjects among the poset states.

Ideally, the initial SPS should be tailored to the test subject. An initial SPS which heavily weights the true state of the test subject will lead to fast and accurate classification. Individualized initial SPSs can be constructed by using prior information concerning the test subject's domain state. In the case of humans, performance on examinations, homework, and class recitations can provide guidance. In the case of systems, previous operating performance would provide useful information for tailoring an initial SPS.

After the initialization step 3 has been performed, the classification step 5 takes place. Information necessary to classify a test subject into a domain state is obtained by successively calculating the test subject's SPS at stage n, denoted by $\pi_n$, after the test subject's response to each of a sequence of N administered test items, n taking on values from 1 to N. Additionally, denote the probability at stage n that the test subject belongs to state s to be $\pi_n(s)$, for any i in S. The determination of the value of N depends on the stopping rule. Note that N is random, and that its value is dependent on the current SPS and the remaining available item pool at each stage. The determination of the value of N will be described later.

The test subject's posterior probability $\pi_{(n+1)}(s|X_{n+1}=x, It_{n+1}=i)$ for membership in state s at stage n+1 is obtained from the equation $$\pi_{(n+1)}(s|X_{n+1}=x, It_{n+1}=i) = \frac{f_i(x|s)\pi_n(s)}{\sum_{\text{all } j \in S} f_i(x|j)\pi_n(j)} \qquad (3)$$

where $X_{n+1}=x$ denotes that the test subject's observed response at stage n+1 is x, $It_{n+1}=i$ denotes that item i is the (n+1)th administered item and $f_i(x|s)$ is the class conditional density associated with state s evaluated at x for item i. The symbol $f_i(x|s)$ denotes a class conditional density associated with either a discrete or continuous random variable X (see e.g. Steven F. Arnold, *MATHEMATICAL STATISTICS*, Prentice-Hall, Englewood Cliffs, N.J., 1990, pp. 44–46).

The updating rule represented by the above equation is known as the Bayes rule, and it will be the assumed updating rule. Note that it applies generally when the class conditional density functions are joint densities and/or conditional densities dependent on previous responses. Other updating rules for obtaining $\pi_{(n+1)}(s|X_{n+1}=x, It_{n+1}=i)$ from $\pi_n(s)$ may be used by the system. For alternative updating rules, it will be assumed that the updated state posterior probability value be a function of the SPS at stage n and the class conditional densities for all the states in S evaluated at observed response x. They should also have the property that for observed response $X_{n+1}=x$ for any item i and fixed conditional density values for all states not equal to s, $\pi_{(n+1)}(s|X_{n+1}=x, It_{n+1}=i))$ is non-decreasing in $f_i(x|s)$. This should hold for all s in S and possible responses x. Of course, Bayes rule is an example of such an updating rule.

After N test items have been administered to the test subject, the test subject is classified. After a test subject is classified, the remediation step 7 can take place by providing the human test subject with the knowledge he does not have or by providing a technician the necessary information to repair at least some of the functional defects existing in the test subject.

Figure 3:
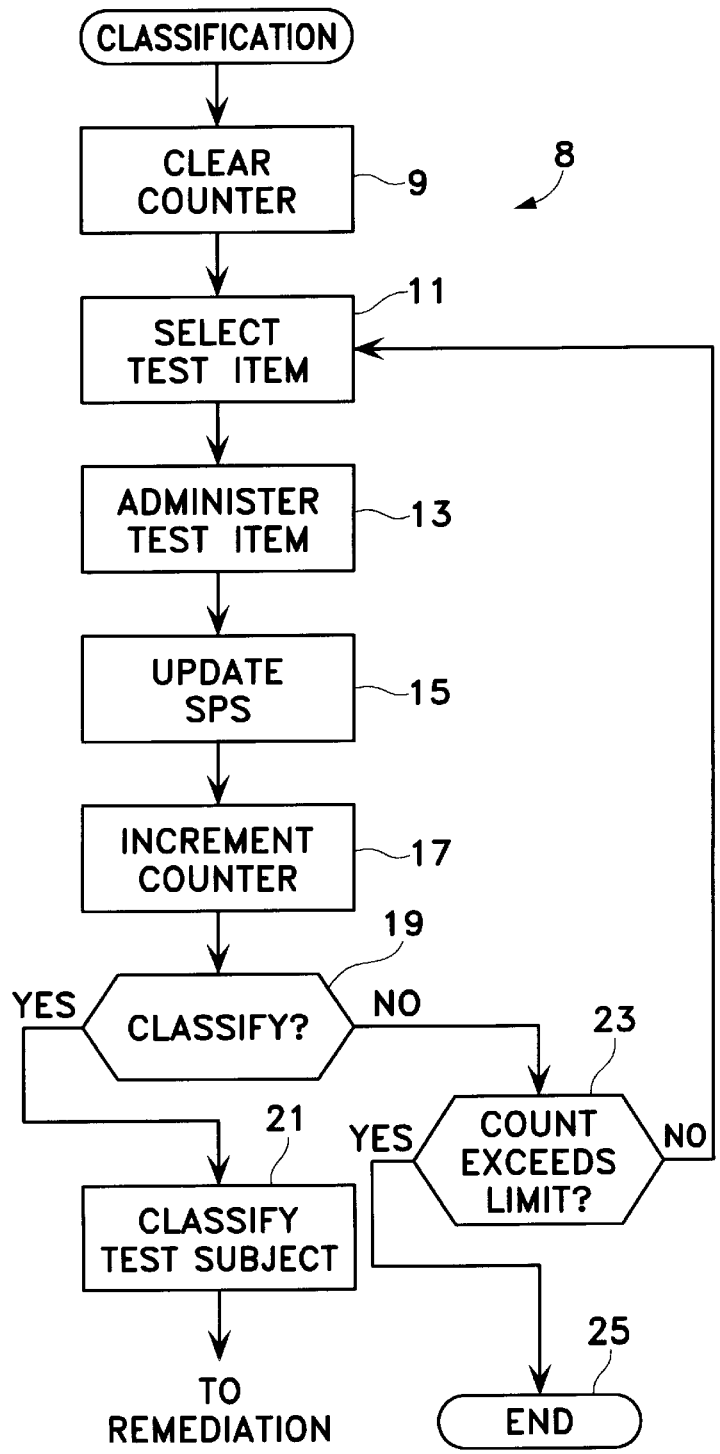
FIG. 3 shows the flow diagram associated with one embodiment of the classification step shown in FIG. 2.

The flow diagram associated with one embodiment 8 of the classification step 5 is shown in FIG. 3. The first step 9 is to clear the test item counter which keeps track of the number of test items administered to the test subject. In step 11, the test item to be administered to the test subject is selected. A test item is selected from the test item pool by applying an item selection rule.

A useful approach to developing item selection rules is to employ an objective function to measure the "performance" or "attractiveness" of an item in the classification process. In practice, this objective function may be dependent upon an item's characteristics such as how it partitions the poset model, what the corresponding distributions are within the partitions, an SPS, and/or the observed item response. Clearly, the probability values in the SPS and the item responses can vary. The objective function can be weighted, usually by a class conditional density, and the weighted objective function summed/integrated over all the possible values for the inputs used by the objective function. In this way, one can obtain an "average" or "expected" value of the objective function which can, for instance, systematically take into account the variation in the SPS and/or the variation of the possible item responses.

This is done by summing/integrating over all possible input values the product of the objective function and the corresponding weighting function. Examples are given below. For the examples, it will be assumed that the system is at stage n, and that the current SPS is $\pi_n$.

An important class of objective functions are uncertainty measures on an SPS. These are defined to be functions on an SPS such that the minimum value is attained when all but one of the values in the SPS has value zero. This minimum may not be unique in that other SPS configurations may attain the minimum as well.

A subset of item selection procedures which employ uncertainty measures as an objective function are those that gauge the uncertainty among the mass on an item's partitions with respect to an SPS. For such procedures, it is desirable for the item partitions to have a high level of (weighted) uncertainty. The idea is that the more the mass is spread across an item's partitions, the more efficiently the item can discriminate between states that have significant mass in the SPS ("the more birds that can be killed by one stone"). This is important because in order to build a dominant posterior probability value in the SPS, item sequences must discriminate between or separate all states with significant mass. Conversely, note that if all the mass is on one partition, there will be no change in the SPS if the updating rule is Bayes rule. The motivation of these procedures is to avoid this scenario as much as possible as measured by an uncertainty measure. Assuming that all items have a partition corresponding to a PDOI generated by a state in S, consider the simple example below, which selects item i in the available item pool that minimizes $$h(\pi_n, i) = |m_n(i) - 0.5| \quad (4)$$

and where $$m_n(i) = \sum_{j \geq e(i)} \pi_n(j) \quad (5)$$

and e(i) is the type of test item i. For this criterion, as with all others, ties between items can be randomized. Note $m_n(i)$ is the mass on one of the partitions of item i at stage n, and the objective function $|m_n(i) - 0.5|$ measures uncertainty among the item partitions with respect to the SPS at stage n, $\pi_n$. Actually, to satisfy the earlier definition of an uncertainty measure, we need to multiply the objective function by (-1).

This rule is based on a very simple criterion which is an advantage in terms of computational complexity. However, the rule is not very sophisticated. It does not take into account the response distributions of each test item. Also, the rule may not perform well when the test items have more than two partitions.

Another motivation for classification is that it is desirable for the SPS to have mass concentrated on or around one element. Using the uncertainty measures with the defining property should encourage selection of items that on average lead towards the ideal SPS configuration of mass on one point.

An important example of an uncertainty function is Shannon's entropy function $En(\pi_n)$ where $$En(\pi_n) = \sum_{i \in S} [-\pi_n(i) \log(\pi_n(i))] \quad (6)$$

Note that the minimum is indeed attained when one element in the poset model has value 1 in the SPS. A weighted version of this objective criterion is $sh_1(\pi_n, i)$ where $$sh_1(\pi_n, i) = \int En(\pi_{(n+1)} | X_{(n+1)} = x, It_{(n+1)} = i) P(X_{(n+1)} = x | \pi_n, It_{(n+1)} = i) dx \quad (7)$$

where i now denotes any test item in the test item pool that has not yet been administered to the test subject. The symbol $En(\pi_{(n+1)} | X_{(n+1)} = x, It_{(n+1)} = i)$ denotes En as a function of $\pi$ calculated after the test subject responds to the (n+1)'th administered test item given the response by the test subject to the (n+1)'th administered test item $X_{(n+1)}$ equals x and the (n+1)'th administered test item $It_{(n+1)}$ equals i. The symbol $P(X_{(n+1)} = x | \pi_n, It_{(n+1)} = i)$ denotes the mixed probability that $X_{(n+1)}$ equals x given $\pi_n$ and given that item i was chosen to be the (n+1)'th administered item.

Note that the equation is based on $\pi_{(n+1)} | X_{(n+1)} = x, It_{(n+1)} = i$ which denotes the SPS at stage n+1 given the observed response for the item administered at stage n+1 is x and the item selected for stage n+1 is item i. This criterion selects the item i in the available item pool which minimizes the right-hand side of the equation. Note that the weighting function in this case is $P(X_{(n+1)} = x | \pi_n, It_{(n+1)} = i)$ which is given by.

$$P(X_{(n+1)} = x | \pi_n, It_{(n+1)} = i) = \sum_{s \in S} f_i(x|s) \pi_n(s) \quad (8)$$

It is a function of the values in the SPS for each state in S multiplied by the density values of the corresponding response distributions associated with each state. Indeed, it is a mixed probability distribution on the space of possible response values given $It_{(n+1)} = i$ and $\pi_n$ and on the poset model S.

If the class conditional density $f_i(x|s) = f_i(x)$ is associated with the response by a state-s test subject to a test item of type e(i) when e(i) is less than or equal to s and $f_i(x|s) = g_i(x)$ is otherwise associated with the response, then $sh_1(\pi_n, i)$ is given by the following equation $$sh_1(\pi_n, i) = m_n(i) \int En(\pi_{(n+1)} | X_{(n+1)} = x, It_{(n+1)} = i) f_i(x) dx + (1 - m_n(i)) \int En(\pi_{(n+1)} | X_{(n+1)} = x, It_{(n+1)} = i) g_i(x) dx \quad (9)$$

An alternative to $sh_1(\pi_n, i)$ is $sh_1'(\pi_n, i)$:

$$sh_1'(\pi_n, i) = sh_1(\pi_n, i) - E_n(\pi_n) \quad (10)$$

Minimizing $sh_1'(\pi_n, i)$ with respect to i is equivalent to minimizing $sh_1(\pi_n, i)$.

The use of the alternative formulation sh' can lead to a reduction in computational complexity since in the two-partition case, it can be viewed as a convex function of $m_n(i)$. Employing computationally simple item selection rules aids in the feasibility of employing large poset models and employing k-step extensions (see below).

A generalization of this class of selection rules in one that selects a test item to be administered to a test subject which minimizes the expected value of an SPS function after taking into account the possible responses to the next k administered test items, k being an integer. Item selection rules which look ahead k steps are attractive in that they are better able to exploit the potential of the items remaining in the test item pool.

The expected value $sh_k(\pi_n,i)$ of $En(\pi_n)$ after administering k test items can be calculated in a straightforward manner using the recursive formula $$sh_k(\pi_n,i) = \int \left\{ \min_j \{sh_{(k-1)}[(\pi_{(n+1)}|X_{(n+1)}=x, It_{(n+1)}=i), j]\} \times P[(X_{(n+1)}=x|\pi_n, It_{(n+1)}=i)] \right\} dx \quad (11)$$

where "min over j" means the value of the quantity in brackets for an item j from the preceding available item pool which minimizes the value. The version of the equation where P can be represented by $f_i$ and $g_i$ is $$sh_k(\pi_n, i) = \quad (12)$$
$$\sum_{s \geq e(i)} \int \left\{ \min_j \{sh_{(k-1)}[(\pi_{(n+1)}|X_{(n+1)}=x, It_{(n+1)}=i), j]f_i(x)\pi_n(s)\} \right\} dx +$$
$$\sum_{s \not\geq e(i)} \int \left\{ \min_j \{sh_{(k-1)}[(\pi_{(n+1)}|X_{(n+1)}=x, It_{(n+1)}=i), j]g_i(x)\pi_n(s)\} \right\} dx$$

where e(i) is the type of test item i.

The same framework for constructing item selection rules applies to distance measures on two different SPSs: for instance, $\pi_n$ and $\pi_{(n+1)}|X_{(n+1)}=x$, $It_{(n+1)}=i$. Let a distance measure between two SPSs be such that, given SPSs a and b, the distance measure is a function of a and b that attains its minimum given a when a=b. Note that this minimum may not necessarily be unique. The motivation behind such a measure is that it is undesirable for an item not to lead to change between successive SPSs. An example of such a distance function is the sum over all of the states of the absolute difference of corresponding SPS elements associated with each state. Consider the item selection rule based on this objective function which selects item i in the available item pool that maximizes $Kg(\pi_n,i)$ where $$Kg_1(\pi_n, i) = \sum_{s \in S} \int |\pi_{(n+1)}(s|X_{(n+1)}=x, It_{(n+1)}=i) - \pi_n(s)|f_i(x|s)\pi_n(s)dx \quad (13)$$

The version of this equation that is obtained when item i has two partitions represented by $f_i$ and $g_i$ and is associated with type e(i) is $$Kg_1(\pi_n, i) = \quad (14)$$
$$\sum_{e(i) \leq s} \int |\pi_{(n+1)}(s|X_{(n+1)}=x, It_{(n+1)}=i) - \pi_n(s)|f_i(x)\pi_n(s)dx +$$
$$\sum_{e(i) \not\leq s} \int |\pi_{(n+1)}(s|X_{(n+1)}=x, It_{(n+1)}=i) - \pi_n(s)|g_i(x)\pi_n(s)dx$$

Note that each term in the sum comprising the distance function on the SPSs is weighted correspondingly by the weighting function $\pi_n(s)f_i(x|s)$ for each s in S and possible response x given $It_{(n+1)}=i$ and $\pi_n$.

$$Kg_k(\pi_n, i) = \quad (15)$$
$$\sum_{s \in S} \int \left\{ \min_j Kg_{(k-1)}[(\pi_{(n+1)}|X_{(n+1)}=x, It_{(n+1)}=i), j] \right\} \cdot f_i(x|s)\pi_n(s)dx$$

where "min over j" means the value of the quantity in brackets for an item j from the preceding available item pool which minimizes the value.

Yet another important class of item selection rules are based on objective functions that measure the "distance" or "discrepancy" between class conditional densities associated with the various states in S. The term "distance" or "discrepancy" is to be interpreted as a measure of the discrimination between the class conditional densities. Formally, it is assumed that a discrepancy measure is a function of two class conditional densities such that, for class conditional densities c and d, the discrepancy measure takes on its minimum given c when c=d. This minimum may not be unique. The motivation of adopting such objective functions is that items become more desirable for classification as the discrepancy between its class conditional densities increases. Conversely, if class conditional densities are equivalent, then statistically there will be no relative discrimination between the respective states in the subsequent SPS.

An example of item selection rules based on such objective functions include those that select the item i in the available item pool which maximizes the weighted discrepancies $wd(\pi_n,i)$ where $$wd(\pi_n, i) = \sum_j \sum_k \pi_n(j)\pi_n(k)d_{jk}(i) \quad (16)$$

where $d_{jk}(i)$ is a discrepancy measure between the class conditional densities of states j and k for item i. Note that each distance between a pair of states is weighted by the product of the corresponding probability values in the current SPS. A particularly simple $d_{jk}(i)$ is the one which equals 0 if $f_i(x|j)$ equals $f_i(x|k)$ and 1 otherwise.

As an illustration, suppose item i partitions the set of states into two subsets with item type denoted by e(i). Suppose $f_i(x|j)$ equals $f_i$ when $e(i) \leq j$ and equals $g_i$ otherwise. Examples of discrepancy measures for $f_i$ and $g_i$ include the Kullback-Liebler distance given by $$d_{jk}(i) = \int \log[f_i(x)/g_i(x)]f_i(x)dx; \; j \geq e(i), k \not\geq e(i)$$
$$d_{jk}(i) = \int \log[g_i(x)/f_i(x)]g_i(x)dx; \; j \not\geq e(i), k \geq e(i) \quad (17)$$
$$d_{jk}(i) = 0 \; j,k \geq e(i), \; j,k \not\geq e(i)$$

and the Hellinger distance given by $$d_{jk}(i) = \begin{cases} \sqrt{1/2 \int \left(\sqrt{f_i(x)} - \sqrt{g_i(x)}\right)^2 dx} & ; \quad j \geq e(i), k \not\geq e(i) \text{ or} \\ & \quad j \not\geq e(i), k \geq e(i) \\ 0 & ; \quad \text{otherwise} \end{cases} \quad (18)$$

Still another class of item selection rules are the k-step look-ahead rules. These rules employ as objective functions loss functions such as those described earlier. Again, the objective functions will usually be weighted over the possible input values. The motivation behind such criteria is to reduce the average cost of misclassification while balancing the average cost of observation. There are a variety of possible loss functions that one might use. Importantly, the loss function used in item selection may differ from that used in the integrated risk determination (see above). If the same loss function is used, then the k-step look-ahead rule selects the best k-step strategy which leads to the greatest reduction in the integrated risk within a k-step horizon. Note that it is possible that less than k items may be administered in a k-step strategy.

A one-step look-ahead rule can be based on the expected loss $LA_1$ defined by the equation $$LA_1(\pi_n, i) = \sum_{s \in S} \int L(s, d(x), 1) f_i(x|s) \pi_n(s) dx \quad (19)$$

where $L(s,d(x),1)$ is the loss function, and item i is selected from the available test item pool. Of the remaining yet to be administered items in the test item pool, the one which is associated with the smallest value of $LA_1$ would be chosen as the (n+1)'th item to be administered. It may be assumed that $d(x)$ is the Bayes decision rule after response x is observed.

If the class conditional density $f_i(x|s) = f_i(x)$ is associated with the response by a state-s test subject to a test item i of type $e(i)$ when $e(i)$ is less than or equal to s and $f_1(x|s) = g_i(x)$ is otherwise associated with the response, then $LA_1(\pi_n, i)$ is given by the following equation $$LA_1(\pi_n, i) = \sum_{e(i) \leq s} \int L(s, d(x), 1) \pi_n(s) f_i(x) dx + \sum_{e(i) \not\leq s} \int L(s, d(x), 1) \pi_n(s) g_i(x) dx \quad (20)$$

where $L(s,d(x),1)$ can be viewed as a function of $\pi_{(n+1)}|X_{(n+1)} = x$, $It_{(n+1)} = i$. If the loss function has constant cost of observation and 0–1 misclassification cost, this criterion reduces to choosing the item that will give the largest expected posterior value in $\pi_{(n+1)}$.

A k-step look-ahead rule utilizes the expected loss $LA_k$ in administering the next k test items. The quantity $LA_k$ is defined recursively by the equation $$LA_k(\pi_n, i) = \quad (21)$$

$$\sum_{s \in S} \int \left\{ \min_j LA_{(k-1)}[(\pi_{(n+1)}|X_{(n+1)} = x, It_{(n+1)} = i), j] \right\} \cdot f_i(x|s) \pi_n(s) dx$$

where "min over j" means the value of the quantity in brackets for an item j from the preceding available item pool which minimizes the value. The version of the equation when item i has two partitions represented by $f_i$ and $g_i$ and is associated with type $e(i)$ is $$LA_k(\pi_n, i) = \quad (22)$$

$$\sum_{e(i) \leq s} \int \left\{ \min_j \{LA_{(k-1)}[(\pi_{(n+1)}|X_{(n+1)} = x, It_{(n+1)} = i), j] f_i(x) \pi_n(s)\} \right\} dx +$$

$$\sum_{e(i) \not\leq s} \int \left\{ \min_j \{LA_{(k-1)}[(\pi_{(n+1)}|X_{(n+1)} = x, It_{(n+1)} = i), j] g_i(x) \pi_n(s)\} \right\} dx$$

Not all reasonable item selection rules need be based directly on objective functions. First, let us begin with the definition of an important concept in item selection. An item i is said to separate the states $s_1$ and $s_2$ in S if the integral/sum over all possible responses of the class conditional density $f_i$ given $s_1$ and/or $f_i$ given $s_2$ of the absolute difference of the class conditional densities is greater than zero. In other words, states $s_1$ and $s_2$ are separated if, with positive probability with respect to one of the densities, the respective two-class conditional densities are different. This definition can be generalized to: an item is said to separate two states if for a discrepancy measure such as in equations (18) or (19) for the corresponding class conditional densities, the resultant value exceeds a predetermined value. The class of discrepancy measures utilized in the invention coincides with those utilized in item selection rules based on weighted discrepancy measures. Indeed, the criterion for separation can be generalized further by considering a plurality of discrepancy measures, and establishing the separation criterion to be satisfied if for instance two or more measures exceed predetermined values, or all the measures exceed a predetermined value, or other such conditions.

Let us now introduce the function $\Phi$ which, given a separation criterion and two states in S, determines if an item from a given item pool indeed separates the two states. The outcome "yes" can be assigned the value 1 and "no" the value 0. An application of $\Phi$ is to generate for two states the subset of items which separates them from the available item pool.

Figure 6:
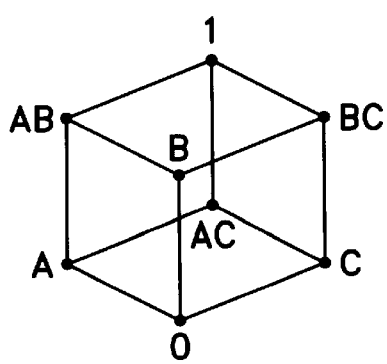
FIG. 6 depicts a poset model as a Hasse diagram.

As an illustration, suppose the poset in FIG. 6 is the underlying model S. Further, let the corresponding item pool contain four items, each with two partitions, of types C, AC, BC, and 1 respectively and whose corresponding class conditional densities satisfy the given property of separation. Then, for states AC and BC for instance, given this item pool, $\Phi$ can be used to generate the subset of items which separate them, the items of types AC and BC. All this involves is to group together all items for which their $\Phi$-values are equal to 1.

The function $\Phi$ can also be used to generate reasonable item selection rules. One procedure is as follows:

1. Find the two states in S with the largest values in the current SPS at stage n;
2. Use $\Phi$ to identify items in the available item pool that will separate these states;
3. Select the item in the resultant subset of items provided by $\Phi$ with the largest discrepancy value with respect to a discrepancy measure such as in equations (18) and (19) of the class conditional densities of the two states, or, allow the system to randomize selection among those items, thus avoiding use of an objective function altogether. The class of discrepancy measures that can be used in this item selection procedure is equivalent to the class that can be used in the item selection rules based on discrepancy measures on class conditional densities.

All the rules discussed above can be randomized. This involves introducing the possibility that the item selected by a given rule at a given stage may, with positive probability be exchanged for another item. This randomization may be weighted by the relative attractiveness of the items with respect to the item selection criterion.

One technique which implements such randomization of item selection is simulated annealing (see S. Kirkpatrick et al., "Optimization by Simulated Annealing", *Science*, 220, pp. 671–679). The inclination to "jump" to another item is regulated by a "temperature" (i.e. the probability distribution associated with the randomization process is controlled by a "temperature" parameter). The higher the temperature, the more likely a jump will occur. An item selection rule used in conjunction with simulated annealing can be run at various temperatures, with each run referred to as an annealing.

Specifically, one implementation of simulated annealing would be to regulate jumping with a Bernoulli trial, with the probability of jumping a function of the temperature parameter. The higher the temperature, the higher the probability that a jump will indeed occur. Once a jump has been decided upon, the probability distribution associated with alternative items could for instance be proportional to the respective relative attractiveness of the items with respect to the item selection criterion in question.

The motivation for employing such a modification to an item selection rule is that sometimes myopic optimization may not necessarily lead to item sequences with good overall performance as measured for instance by the integrated risk. Several annealings can be run and the corresponding strategies analyzed to see if improvement is possible.

Another technique for possibly improving upon a collection of item selection rules is to hybridize them within a k-step horizon. This procedure develops new item selection rules based upon collections of other rules. For each rule in a given collection, a k-step strategy is constructed at each stage in the classification process. The hybridized rule selects the item which was used initially in the best of the k-step strategies as judged by a criterion such as the integrated risk with respect to the current state SPS. (A different loss function to judge the k-step strategies than the one used for the general classification process may be used.) Hence, the hybridized rule employs the item selection rule which is "best" at each particular state in terms of a k-step horizon, so that overall performance should be improved over just using one item selection procedure alone.

Other hybridizing techniques are possible. As an example, given a plurality of item selection rules, an item can be selected randomly from the selections of the rules. Alternatively, each test item in the available test item pool can be assigned a relative ranking of attractiveness with respect to each selection rule: for instance "1" for the most attractive, "2" for the second most attractive, etc. The test item with the highest average ranking among the selection rules is selected. Clearly, the ranking values can also be based on the relative values of weighted objective functions. In general, criteria based on weighted relative rankings of attractiveness with respect to a plurality of item selection rules will be referred to as relative ranking measures, with the higher the weighted relative ranking, the more attractive the item.

After selecting the next test item in step 11 of the classification process 5 shown in FIG. 3, the selected test item is flagged which indicates that the selected test item is not available for future selection. The selected test item is then administered to the test subject and the test subject's response is recorded in step 13. The test subject's SPS is then updated in step 15 in accordance with equation (3) and the test item counter is incremented in step 17.

The decision is made in step 19 as to whether at this point the administering of test items should be stopped and the test subject classified. The simplest criterion for making this decision is whether or not any of the members of the test subject's SPS exceeds a classification threshold. If any of the members of the test subject's SPS does exceed the threshold, the test subject is classified in step 21 in the state associated with the member of the test subject's SPS having the greatest value and the remediation process 7 begins.

If none of the members of the test subject's SPS exceeds the classification threshold, the test item count recorded in the test item counter is compared with a test item limit in step 23. If the test item count is less than the test item limit, the classification process returns to the item selection step 11 and the process continues. If the test item count exceeds the test item limit, it is concluded that the classification process is not succeeding and the classification process is terminated in step 25. The classification process may not succeed for a variety of reasons. For example, if the responses provided by the test subject are inconsistent with respect to any state in S (i.e. no dominant posterior probability emerges in the SPS functions), it would be impossible to properly classify the test subject.

Another possible stopping rule that may be employed is the k-step look-ahead stopping rule. It involves the same calculations as with a k-step look-ahead item selection rule and results in a k-step strategy $\delta_k$ with respect to the classification decision-theoretic loss function.

Given a current SPS, the system must decide whether to continue or stop. The k-step look-ahead stopping rule will favor stopping if $R(\pi_n, \delta_k) >= R(\pi_n, \delta_0)$, where $\delta_0$ is the strategy that stops at the current position. The strategy $\delta_k$ may be represented by a strategy tree (see below). Of course, other item selection criteria can be used to construct $\delta_k$ besides that of the equation for $LA_k$ given above. Additionally, the loss function used in the k-step look-ahead stopping criterion may differ from those used in other contexts.

The k-step look-ahead stopping rules can be based on other weighted objective criteria besides a loss function. Consider the uncertainty and distance measures on SPS vectors. After constructing $\delta_k$ at a given stage, if the weighted (expected) reduction in an uncertainty measure is less than a predetermined value, or the increase in the distance between the weighted (expected) SPS at stage n+k and the current SPS is not greater than a specified value, stopping may be invoked.

Stopping rules do not necessarily have to look ahead k steps. A stopping rule may be a function of the current SPS. For instance, if a weighted uncertainty measure on the current SPS is less than a predetermined value, stopping can be invoked. Similarly, if a weighted distance measure, for instance, between the initial SPS and the current one is larger than a predetermined value, it would be attractive to stop, and stopping can be called. Using loss functions, a stopping rule could depend on whether or not a weighted loss is less than a predetermined value. A stopping rule could be based on such a criterion as well. Weighting for these stopping rule criteria could for instance be with respect to the class conditional density values corresponding to the test item responses administered up to the current stage and the initial SPS.

Consider the following examples. Suppose a loss function has a cost of observation of 0 until n>10 and then becomes 1 with no misclassification cost. The corresponding stopping rule for this loss function will invoke stopping if and only if the number of observations reaches 10 (cf. FIG. 3, step 23). Note how this loss function belongs to the class of loss functions described earlier. Also note that this loss function is tailored for developing reasonable stopping rules and may not correspond to the loss function used in the integrated risk function.

Consider now the uncertainty measure which calculates the quantity (1 minus the largest posterior probability in the SPS). The corresponding stopping rule could then be the simple one described above, which stops if the largest posterior probability in the current SPS exceeds a threshold value. Note that the two examples described above can be used in conjunction to develop a stopping criterion, such as invoking stopping if and only if one or both of the rules calls for stopping. An alternative would be to invoke stopping if and only if both rules call for stopping. Clearly, with a plurality of stopping rules, various such combinations can be used in constructing a new stopping rule.

Recall that the decision rule which minimizes the integrated risk with respect to a loss function and initial SPS is called the Bayes decision rule. The decision rule is a function of the observed response path and its corresponding response distributions. Due to computational difficulty, it may sometimes be easier to use a Bayes decision rule from a different context (i.e. different initial SPS and different loss function). For example, if misclassification costs vary among the states in S, it may not always be the Bayes decision rule to select the state with the largest posterior probability in the final SPS, yet it may still be attractive to do so.

Moreover, when the underlying poset model has an infinite number of states, it is possible for purposes of deriving a decision rule to let the initial SPS have infinite mass. The best decision rules in terms of minimizing the integrated risk with respect to such initial SPS prior distributions are called generalized Bayes rules. These rules also may be useful. Once again, note that the loss functions used in the decision process may differ from those used in the classification process (integrated risk criterion) and those used in item selection and/or stopping. As in item selection, when using stopping or classification decision criteria, ties between decisions can be randomized. For emphasis, it should be noted that item selection and/or stopping rules can vary from stage to stage and decision rules from test subject to test subject.

Figure 4:
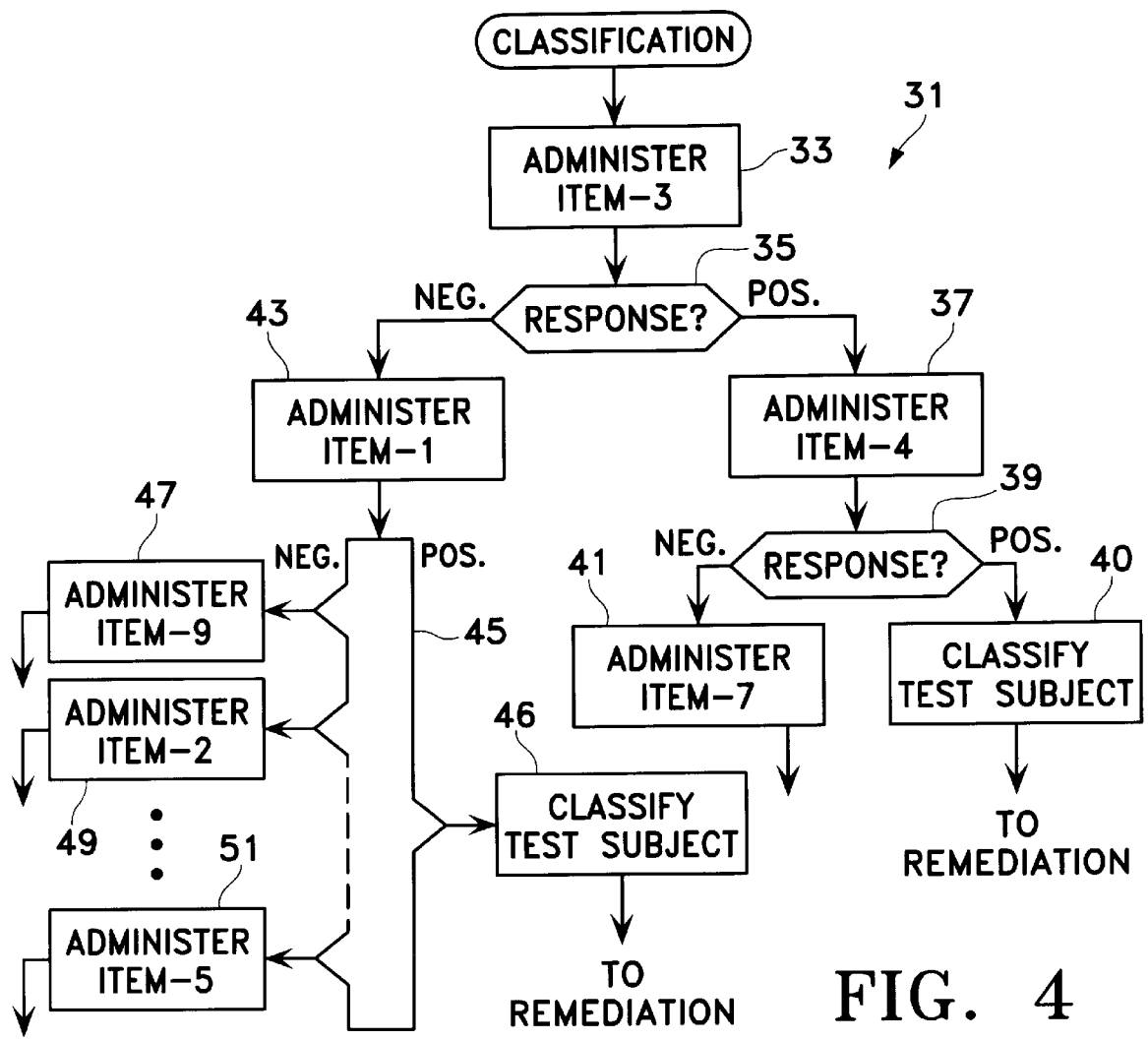
FIG. 4 shows a portion of a strategy tree embodiment of the classification step shown in FIG. 2.

A portion of a strategy tree embodiment 31 of the classification step 5 is shown in FIG. 4. A strategy tree specifies the first test item to be administered together with all subsequent test items to be administered. Each test item in the strategy tree after the first is based on the test subject's response to the last test item administered and the updated SPS. Strategy trees are representations of strategies. A strategy tree is a plurality of paths, each path beginning with the first test item to be administered, continuing through a sequence alternating between a particular response to the last test item and the specification of the next test item, and ending with a particular response to the final test item in the path. The classification of the test subject, based on the final updated SPS for each path, is specified for each path of the strategy tree. Note that strategy trees can be used when the response distributions are continuous if there are a finite number of possible response intervals associated with an item choice. Also, multiple branches emanating from a node in the tree indicates multiple possible response outcomes.

Thus, the identity of the next test item in the strategy tree can be determined by referencing a memory location keyed to the identity of the last test item administered and the response given by the test subject to the last test item. The last test item to be administered for each path in the strategy tree is identified as such in the memory, and each response to that last test item is associated in memory with the appropriate classification of the test subject who has followed the path that includes that particular response. Directions for remediation are also stored in memory for each path of the strategy tree.

It is assumed in FIG. 4 that the test subject's response to a test item can be either positive or negative. The first item to be administered is specified by the strategy tree to be item-3 and is administered in step 33. The response is analyzed in step 35. If the response to item-3 is positive, the next item to be administered is specified by the strategy tree to be item-4 which is administered in step 37. The response to item-4 is analyzed in step 39. If the response to item-4 is positive, the administering of test items ceases, classification of the test subject occurs in step 40, and the test subject transitions to the remediation step 7 (FIG. 2). If the response to item-4 is negative, item-7 is administered in step 41 in accordance with the strategy tree specification. The process continues in a similar manner after step 41 until a stopping point is reached and classification occurs.

If the response to item-3 is determined in step 35 to be negative, item-1 is administered in step 43 as specified by the strategy tree and analyzed in step 45. If the response to item-1 is positive, the administering of test items ceases, classification of the test subject occurs in step 46, and the test subject transitions to the remediation step 7 (FIG. 2). If the response to item-1 is negative, either item-9, item-2, . . . , item-5 is administered in steps 47, 49, . . . , 51, as specified by the strategy tree. The process continues after these steps until a stopping point is reached and classification occurs.

Such strategy trees are developed starting with the initial SPS and the test item pool, and determining the sequence of test items to be administered using the test item selection procedures described above. A strategy tree branches with each administration of a test item until stopping is invoked by a stopping rule.

It may be possible to create a more efficient strategy tree from an existing one by evaluating a weighted loss function one or more test items back from the final test item in a path and determining whether the additional test items in the strategy tree are justified by a reduction in the weighted loss function.

Figure 5:
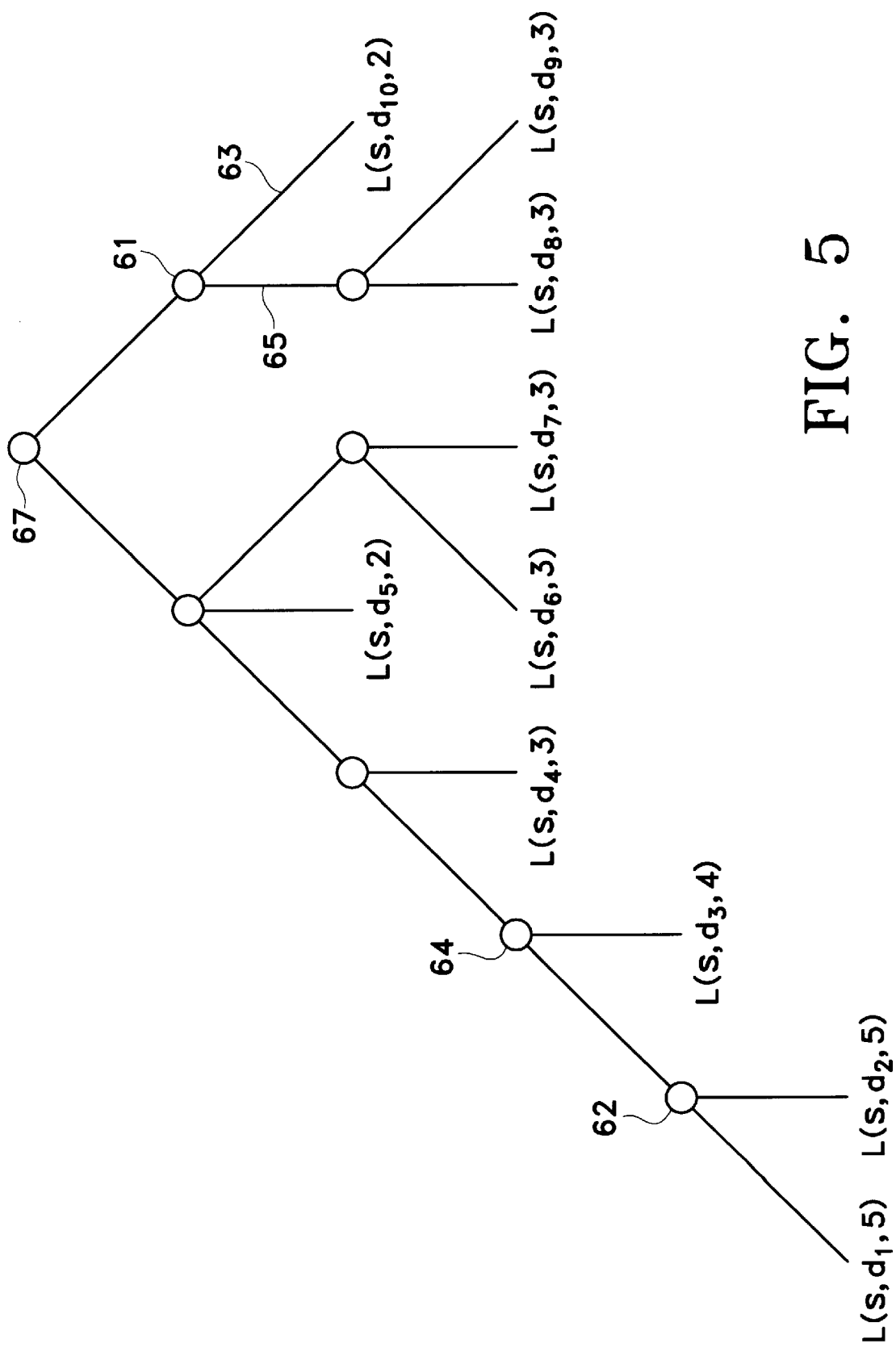
FIG. 5 shows the relationship between the loss function and a strategy tree.

The relationship between the loss function and a strategy tree is illustrated in FIG. 5. A circle 61 denotes a test item and line segments 63 and 65 denote the possible responses to the test item. Test item 67, the first test item in the strategy tree, is the beginning of all paths in the strategy tree. Each path terminates with a line segment such as line segment 63 which does not connect to another test item. The loss function $L(s,d,n)$ for each path can be determined after classification occurs at the end of each path, assuming the test subject's true classification is s, as indicated in FIG. 5.

The loss function cannot be used directly in refining a strategy tree since one never knows with absolute certainty the true classification of a test subject. Instead, the weighted loss function (i.e. integrated risk) $R(\pi_0, \delta)$ is used for this purpose.

As mentioned above, a strategy tree can be refined by using the weighted loss function. Suppose the weighted loss function of the strategy tree $\delta_1$ of FIG. 5 is $R(\pi_0, \delta_1)$. Now eliminate test item 62 and call this revised tree $\delta_2$ with an weighted loss function $R(\pi_0, \delta_2)$. If $R(\pi_0, \delta_2)$ is less than $R(\pi_0, \delta_1)$, the reduced weighted loss function suggests that strategy tree $\delta_2$ is preferable to original strategy tree $\delta_1$.

Rather than eliminating only one test item, one might choose to eliminate test items 62 and 64, thereby obtaining strategy tree $\delta_3$. Again, if $R(\pi_0, \delta_3)$ is less than $R(\pi_0, \delta_1)$, the reduced weighted loss function suggests that strategy tree $\delta_3$ is preferable to original strategy tree $\delta_1$. There are obviously many possible modifications of the original strategy tree that might be investigated using the weighted loss function as the criterion of goodness. A systematic approach would be to employ a "peel-back" approach. This entails "growing" the tree with a computationally-simple stopping rule such as the one which decides to stop when one of the states in S has a posterior probability value which exceeds a threshold value or when the number of observations exceeds a threshold. Then, the system can "peel-back" the tree and refine the stopping rule in terms of the weighted loss function by applying a k-step look-ahead stopping rule only to all the sub-trees at the end of the tree with a branch at most k steps from termination (k>=1). This approach becomes attractive when applying the k-step look-ahead stopping rule at each stage in the strategy tree is computationally expensive.

An important application of the technology used to generate sequential test sequences is in the development of fixed sequence tests. A fixed sequence test (fixed test) is a sequence of items that are to be administered to all test subjects, with no sequential selection involved. A test length may be predetermined or can be determined during design given a decision-theoretic framework as used in the sequential setting. Indeed, the same classification framework can be used in the fixed test context as well (use of loss functions with costs of misclassification and observation, integrated risk functions, an initial SPS, etc.). The objective for this problem then is to choose the fixed sequence from an item pool which minimizes the integrated risk for a given loss function and initial SPS. Note that choosing the test length (i.e. deciding when to stop) may be an issue since the loss function may include a cost of observation. Also, note that during actual administration of a given fixed test, it is possible to allow test subjects to stop before completing all of the test items in the fixed sequence, using stopping rules as described earlier. Decision rules are analogous in the fixed test context in that their objective is to make a classification decision which minimizes a weighted loss function.

All the previous item selection rules such as those based on weighted objective functions can be adapted to this application as well, along with the techniques of extending them for k-step horizons, hybridizing a collection of them, and introducing randomization to the selection process. As an example, items can be selected iteratively via the sh-criterion by choosing at stage n+1 the item i from the remaining available item pool which minimizes $$\int_{x_{n+1}} \ldots \int_{x_1} E_n(\pi_{n+1}|X_1 = x_1, It_1 = i_1, \ldots, X_{n+1} = x_{n+1}, It_{n+1} = i) \cdot \quad (23)$$
$$P(X_1 = x_1, \ldots, X_{n+1} = x_{n+1}|\pi_0, It_1 = i_1, \ldots, It_{n+1} = i) dx_1 \ldots dx_{n+1}$$

where $i_1, i_1, \ldots, i_n$ are the previously selected items at stage 1 up through stage n respectively and $$P(X_1 = x_1, \ldots, X_{n+1} = x_{n+1}|\pi_0, It_1 = i_1, \ldots, It_{n+1} = i) \quad (24)$$
$$= \sum_{s \in S} f_{i_1, \ldots, i_n, i}(x_1, \ldots, x_n, x_{n+1}|s)\pi_0(s)$$

The function f is the joint class conditional density for responses $x_1, \ldots, x_n, x_{n+1}$ given state s and item sequence $i_1, \ldots, i_n, i$. In addition, the probability of a test subject being in a particular test item partition can be calculated for instance by weighting the probability values that would be given by the possible SPSs that could result from administration of the fixed test items up to state n. Recall that the probabilities of a test subject being in a test item's partitions are quantities used by certain item selection rules.

Item selection criteria based on the function $\Phi$ can also be used in this context as well. First, list all pairs of states that need to be separated, optionally giving more weight to certain separations (e.g. requiring that a certain separation should be done twice). The objective in selecting a fixed sequence would then be to conduct as many of the desired separations as possible, using for a given pair of states and a given separation criterion the function $\Phi$ to determine whether an item results in a separation between them. An item selection criterion would be to choose an item which results in as many of the remaining desired separations as possible. Once an item is administered, the list of desired remaining separations is updated by removing the resultant separations.

In the strategy tree context, the restriction that the same item sequence be administered to all test subjects is equivalent to requiring all branches in a tree to be equivalent. In general, one can view the process of selecting a fixed test as a special case of the general sequential analytic problem. At each stage n of the tree-building process, n>=1, instead of allowing each node to be associated with its own item, developing a fixed test is equivalent to requiring that all nodes at the same stage n of the test share the same item selection. Note that the "peel-back" approach to constructing a stopping rule can still be applied.

Conversely, developing fixed test sequences has application in sequential testing. Recall k-step look-ahead item selection and stopping rules, which require development of a k-step horizon strategy at each stage. This can be computationally costly if k is large and the poset model and item pool are complex. As an alternative, one can instead calculate a fixed test sequence within a k-step horizon in place of a k-step strategy. Criteria for item selection and stopping based on using a k-step horizon fixed test are analogous.

For both the sequential and fixed test settings, the above techniques can be used to design the item pool (fixed test) in terms of what type of items should be constructed. To gain insight, classification is conducted on hypothetical items with hypothetical item types and item response distributions. Since the classification process is being simulated, an infinite number of each of the item types of interest within a range of class conditional densities that reflect what is to be expected in practice can be assumed. From the hypothetical item pool, strategy trees or fixed sequences can be constructed for various initial SPS configurations. The composition of these constructions in terms of the hypothetical item types selected gives guidance as to how to develop the actual item pool or fixed sequence. Hypothetical item types that appear most frequently on average and/or have high probability of administration for instance with respect to SPSs and class conditional densities are candidates to be constructed. Analyzing the item composition of a number of simulated classification processes is an alternative approach to gaining insight into item pool design. Note that these approaches can be applied to actual test item pools as well. Actual test items that are not administered with high frequency on average and/or do not have high probability of administration, for instance with respect to SPSs and class conditional densities, are candidates for removal.

An important consideration in the implementation of the invention is the development of a model of the domain of interest and the associated test item pool. Concerns in developing the model include whether the model has too many or too few states. Desirable properties of the test item pool include having accurately specified items which strongly discriminate between states and having a sufficient assortment of item types to allow for effective partitioning of the states.

A model is too large when some of the states are superfluous and can be removed without adversely affecting classification performance. A model is too small when some of the important states are missing. An advantage to having a parsimonious model is that for test subjects in states that are specified, it doesn't require on average as many test items to reach the classification stage and to classify with a particular probability of error as it does for a larger model which contains the smaller one. The disadvantage is that test subjects in states that are not present in the model cannot be appropriately classified.

A good model gives useful information concerning the remediation of test subjects. Each state should be meaningful in assessing the knowledgeability or functionality of the test subject. Moreover, the model should be complex enough to be a good representation of all the relevant knowledge or functionality states in a given subject domain. Hence, balancing parsimony while accurately representing the subject domain is the primary challenge of model development.

The selection of items for the test item pool entails determining how effective a test item is in distinguishing between subsets of states. The effectiveness of a test item is determined by the degree of discrimination provided by the response distributions associated with the test item and the subsets of states. The degree of discrimination provided by response distributions can be measured in a variety of ways. Two possibilities are illustrated by equations (18) and (19), with larger values indicating a larger degree of discrimination. In general, discrepancy measures from the same class as employed in item selection can be used.

The starting point for the development of a domain model and its associated test item pool is the postulating of model candidates by experts in the field of the domain and the generation of test item candidates of specified types for the test item pool. Within each model, the experts may have an idea as to which states may be superfluous and where there may be missing states. Further, the experts may have an idea as to which items do not discriminate well between subsets of states or whose association with the domain states may be vague and need to be investigated. These prior suspicions are helpful in that they allow the user to experiment through design of a training sample of test subjects in order to gain information necessary to make decisions about item performance and model structure.

With respect to the relationship between domain models and the test item pool, it is of considerable importance that the item pool can discriminate among all of the states. Whether this is true or not can be determined by a mapping on the poset model, given a test item pool with fixed item partitions. In general, the item partitions may be specified such that they do not necessarily correspond to the subsets with shared class conditional response distributions, and in fact can be specified without taking into consideration actual estimated class conditional response densities. Moreover, separation criteria can be used for specifying alternative partitions, such as grouping together states whose class conditional density discrepancies are small. These alternative partitions can be used below and in item selection rules. The mapping consists of the following sequence of operations: partitioning the domain set of states by means of a first item in the test item pool into its corresponding partition, partitioning each of the subsequent subsets in the same manner by means of a second item, resulting in the further possible partitioning of each partition of the first item; continuing the partitioning of the resultant subsets at each stage of this process by means of a third, fourth, . . . , nth type of item until either there are no more items left in the item pool or until each state in the original poset is by itself in a subset. The latter situation implies that the item pool can discriminate between all of the states in the domain in relation to the fixed item partitions. If the final collection of subsets contains one subset that has more than one member, the implication is that the test item pool cannot discriminate between those states in that subset, again in relation to the fixed item partitions. The image of this mapping can be partially ordered, with the partial order induced in the sense that $x' \leq y'$ for $x'$ and $y'$ in the image if there exists $x$ and $y$ in the original poset such that $x \leq y$ and the images of $x$ and $y$ are $x'$ and $y'$ respectively.

Figure 7:
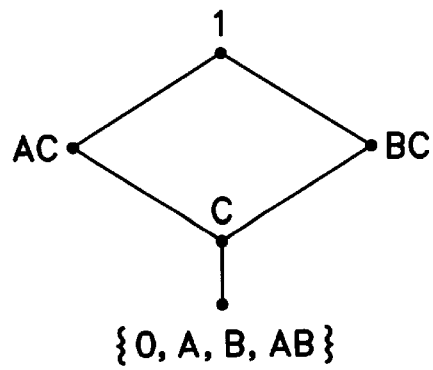
FIG. 7 shows the image of the mapping of a test item pool on the poset model of FIG. 6.

FIGS. 6 and 7 give an illustration of this mapping. Suppose the item pool contains 4 items, each with two partitions and associated respectively with states {C,AC,BC, 1}. FIG. 6 shows the original poset model. FIG. 7 is the image of the mapping on the poset model of FIG. 6. The image shown in FIG. 6 indicates that the test item pool was unable to separate states 0, A, B, and AB.

A resultant image poset can be viewed as the effective working model for classification in relation to the item pool and given item partitions and is a reduction from the original poset model. In practice, this reduction in the number of states can be substantial, depending on the item pool. States that are not discriminated by the mapping are effectively viewed as one state in the image. Also, if classification is to be conducted on the image poset, note that an item's partition must be updated in relation to the new model. If the partial order on the image is induced as above, then an item's partition in the image is just the image of the partition, and the system can automatically update the item type specification.

The unavailability of item types is a natural constraint for the model. Certain item types may be awkward, such as an item requiring exactly one skill. Item construction constraints are a factor in the type of models that can be used in classification. Thus, the mapping described above gives important information about the type of models that can be constructed and whether the item pool needs to be augmented in order to better separate states. It can be used to analyze the performance of a fixed test, to see which states may not be separated by the fixed test.

The mapping on the domain model should be performed immediately after candidate domain models and candidate test item pools have been defined in order to provide insight as to possible constraints imposed on the model and possible flaws in the process for selecting candidate items for the test item pool. The mapping should be repeated for any modifications of the candidate models and test item pools.

Sometimes it is of interest to generate ideal response patterns. Consider the following example from the educational application. Given a poset model, suppose that the response distributions for the items are Bernoulli, and that each item has two partitions. Then, given each item, it can be determined whether a test subject in a specified state in the poset model has the knowledge or functionality to give a positive response, in which case a "1" is used to denote the response. Otherwise a "0" is used to denote the response. The final sequence of 1s and 0s, ordered in the same way as the test items, is referred to as the ideal response pattern. For this case, the ideal response pattern for a test subject in the specified state are the responses that would be observed if the test subject's responses perfectly reflected the test subject's state.

In general, an ideal response for an item given a specified state can be any representative value of the class conditional density for the item. In the continuous response case, this could be the mean of the density. Further, instead of an ideal response value, the ideal response can be represented by an ideal set of values possibly including ideal intervals of values (depending on whether the class conditional density is discrete or continuous). An example of a possibly useful ideal response interval for an item given a specified state is the set of values within a specified distance from the class conditional density mean for that state. When the response is multi-dimensional, an ideal response could be a value or set of values in the multi-dimensional space of possible responses. Ideal response patterns will contain information about each item in a given item sequence.

Given a test subject response pattern g and an ideal pattern h, distance measures on the patterns can be used to gauge whether the ideal pattern is "close" to the test subject pattern. For the example above, a reasonable distance measure would be to count the number of discrepancies between patterns, with an ideal pattern said to be "close" to a test subject pattern if that number is less than a certain specified number, or, equivalently, if the percentage of discrepancies is less than a specified percentage. In general, we will consider distance measures between a test subject pattern g and an ideal pattern h given an administered sequence of test items such that, given a test subject pattern g, a distance measure will attain its minimum when g=h, where g is said to equal h, when h has ideal responses that are a value or set of values, when test subject responses are equal to or contained within the corresponding ideal responses. This minimum may not be unique.

These ideal response patterns can be used in model development in the following way. Given an exploratory sample of test subject response patterns, a state associated with an ideal pattern that is not "close" with respect to a given distance measure to any test subject's actual response pattern suggests that the state may be illusory and should be removed from the domain model. Conversely, if there are a number of test subject response patterns not "close" to any ideal patterns, this suggests that more states may need to be specified. Note that each test subject may have his own sequence of items, which would entail generating ideal responses for each state for each sequence. Also, as with combining a plurality of stopping rules to develop a new stopping rule, a plurality of distance measures can be combined to develop a distance criterion.

An essential step in the test subject classification process is the determination of the parameter values that characterize the class conditional densities associated with each test item and with each test subject state. Bayesian estimation of the class conditional density parameters is a standard statistical approach for obtaining parameter estimates and is analogous to the decision-theoretic framework used in classification (see Steven F. Arnold, *MATHEMATICAL STATISTICS*, Prentice-Hall, Englewood Cliffs, N.J., 1990, pp. 535–570).

Bayesian estimation treats an unobserved parameter (such as the probability that a test subject in a given state will provide a positive response to a test item) as a random variable. The first step is the selection of an initial marginal density for the parameter of interest. This initial marginal density, called the prior distribution, represents a prior belief about the value of the parameter. Data is then collected and the prior distribution is updated using the Bayes rule to obtain a posterior distribution. A decision rule is employed that analyzes the posterior distribution and determines an estimate of the parameter. The "best" decision rule, provided it exists, is called the Bayes decision rule if it minimizes the integrated risk. The integrated risk is the expected value of a risk function with respect to the prior distribution, the risk function being the expected value of a loss function, and the loss function being a measure of the discrepancies between an estimate and the true parameter value. If the loss function is squared error loss for a continuous parameter, then the penalty in inaccuracy is measured by squaring the discrepancy between an estimate and the true value. For this particular loss function the Bayes decision rule is to take as the estimate the mean of the posterior distribution.

Bayesian estimation is just one way of obtaining parameter estimates. There are many other viable approaches to parameter estimation that do not necessarily involve specifying prior distributions, loss functions, etc.

It may be appropriate, depending on the situation, to perform trial classifications of a sample of test subjects using the candidate domain models and candidate test items. Such preliminary trials may reveal problems with the domain model (i.e. too many or too few states), problems with specifying item type, and problems with item discrimination between subsets of states. The preliminary trials may also be helpful in specifying the response distribution parameters for the test items and the initial SPS. A mapping of how well the items in the test item pool discriminate among the states of the domain model may suggest additional types of test items. Finally, a loss function for use in generating strategy trees must be specified.

Further development of the domain model and test item pool depends on tests of this initial configuration using a training sample of test subjects. The focus of the training sample experiments is to collect data concerning model fit and item effectiveness and to do so as efficiently as possible. Item selection for the training sample can be accomplished sequentially as previously described. For this purpose, a training sample strategy tree can be generated. The initial configuration is then exercised with the training sample.

Item types or states that are of particular concern should be the subject of replicated observations. For items of questionable utility insofar as discriminating among states, the updating of the SPS can be deferred so that the observation conditions for a sequence of test items remains the same. Sequences conditional on specific response patterns can be inserted into the item selection sequence/strategy tree and used to test the presence of hidden states or to see if a state is superfluously included.

It is important that every parameter be estimated with enough data to insure accuracy. Items that might not be administered very often should possibly be inserted into the item sequence/strategy tree. Moreover, classification can be delayed by administering more test items to insure classification accuracy.

Data resulting from tests of the training sample are used to refine the estimates of response distribution parameters, and adjustments are made in the model and in the test item pool. Such adjustments may include respecifying item types and condensing models. The adjusted configuration is then exercised, possibly resulting in further adjustments in the domain model and the test item pool.

An estimate of the average classification performance expressed as the weighted value of the loss function in relation to various values of the initial SPS is then obtained through simulation based on the estimated results from the test item pool. This information is useful in deciding upon a final model and test item pool that will be used in classifying future test subjects.

Using the initial estimated item parameter values as specified by the prior distributions, classification of the test subjects in the training sample can be accomplished. A classifying function of the test subject's SPS is used to classify the test subjects. Based on these classifications, the item parameter values are updated. The classifications can then be updated using the new parameter estimates. This iterative process continues until there is reasonable confidence that estimation has been accomplished correctly, such as having the estimated values from iteration to iteration appearing to converge, e.g. the estimated values from iteration to iteration after a certain stage are within a predetermined difference.

An approach to choosing a test subject's classification is one which randomly selects a state in accordance with the current SPS values. One example of this approach is the estimation technique known as Gibbs sampling which utilizes an iterative framework (cf. A. Gelfand and A. Smith, "Sampling-Based Approaches to Calculating Marginal Densities, *Journal of the American Statistical Association* 85, 398–409 (1990)). For the system, it will many times be of interest to impose order constraints among the parameters associated with an item's partitions. Estimation in this context can also be conducted via Gibbs sampling (cf. A Gelfand, A. Smith, and T. M. Lee, "Bayesian Analysis of Constrained Parameter and Truncated Data Problems Using Gibbs Sampling", *Journal of the American Statistical Association*, 87, 523–532 (1992)).

Classification is very important to item parameter estimation because it is used as the basis of the estimates. More precisely, the classification information is used to represent test subjects' state membership. Estimation of the item parameters would be simple if the true states were known. The difficulty arises precisely because the test subjects' states are unknown. The sequential process of administering test items to the training sample of test subjects results in "sharp" posterior probabilities for state membership near 1 or 0, which in turn results in "sharper" item parameter estimates. Discrepancy measures such as those defined by equations (18) and (19) can be used to gauge sharpness. As in developing a separation criterion, a plurality of these measures can be combined for a sharpness criterion. For Bernoulli or multinomial distributions, "sharp" probabilities are those near 1 or 0 with one dominant response for each state.

After item parameter estimation for the training sample of test subjects has been completed, items that are not sharp are removed. Such items have a relatively greater likelihood of giving contradictory evidence as to the identity of the true state because they do not differentiate between states very well.

A measure of an item's effectiveness is how the performance of classification changes overall when it is removed from the item pool. Responses to items that are not sharp have a relatively higher likelihood of giving contradictory information which decreases the sharpness of the posterior values of the SPS and is expensive in terms of the cost of observation needed to rectify the "damage". This in turn has an adverse effect on the sharpness of the other item parameter estimates. Removal of such items thus improves classification performance.

Before removing an item from the test item pool, the item should be checked as to whether it is properly specified as to type. For example, suppose an item is distributed as Bernoulli within both its partitions. Further, suppose that the item type is specified as AB in the poset model of FIG. 8 and the probability of a positive response for test subjects in the PDOI of state AB is significantly less than 1. It may be that the proper specification is actually a state higher than AB in the domain model such as ABC, ABD, or the union of ABC and ABD. On the other hand, suppose that the probability of a positive response for test subjects in a state lower than AB in the model is suspiciously high. The proper specification may actually be a state lower than AB such as A or B. The proper procedure to follow in such situations is to vary the type specification of the test item with the objective of finding a specification for which test subjects in the PDOI of the type designation provide a positive response with a probability reasonably close to 1 and test subjects in states less than the type designation provide a positive response reasonably close to 0.

Another possibility to be considered before removing an item from the test item pool is whether the response distribution itself may be misspecified. If certain erroneous responses occur frequently, it may be appropriate to consider more complex response distributions. For example, a Bernoulli distribution might be extended to a multinomial distribution. Responses from the training sample of test subjects provide information as to frequencies of occurrence of the different responses. Histograms of these response frequencies can be constructed based on the classification results. Distributions can then be reformulated and the new parameters estimated.

Analysis of erroneous responses can speed classification. Suppose initially that an item has a two-element partition (one a PDOI) and that the response distributions are Bernoulli. Further, suppose that a certain erroneous response gives strong evidence that a test subject has a particular lack of functionality and/or lack of possession of a particular set of facts. The response distribution for test subjects in the complement of the PDOI may be respecified to a multinomial to take into account this particular erroneous response. The response distribution for states not in the complement does not necessarily have to be changed as well. A third partition within the complement set may be created to reflect that the particular erroneous response strongly suggests membership in it. Hence, rather than grouping all erroneous responses as negative, information about such responses can be exploited in the classification process. The above scenario illustrates the utility in being able to respecify item type and/or the type of response distributions.

If a test item is under suspicion initially, then a well-designed training sample should replicate the item's type in question to directly compare performance of the estimates. Examining similarly constructed items should help in verifying both the type specification and assessing relative performance.

Model fitting and item analysis are very much intertwined. An important consideration in evaluating item performance is the possibility that the model itself may be misspecified. A misspecification in the model may lead to parameter estimates for an item that are not sharp when they actually should be. This can happen if a state representing an important cognitive ability or function is hidden and a misspecified item involves that ability or function. The misspecified item may in fact be very good in terms of differentiating knowledge or functionality levels. By correcting the model, this may become apparent. On the other hand, models may not appear to fit well due to poor items. Thus, both possibilities must be examined simultaneously.

A way of determining whether a model is a good fit is to analyze the classification performance assuming that the items are all good discriminators having sharp distributional properties and that they are specified correctly. Consider the description below as an illustration. For the sake of discussion, suppose that the items are associated with a state and have two partitions.

Figure 8:
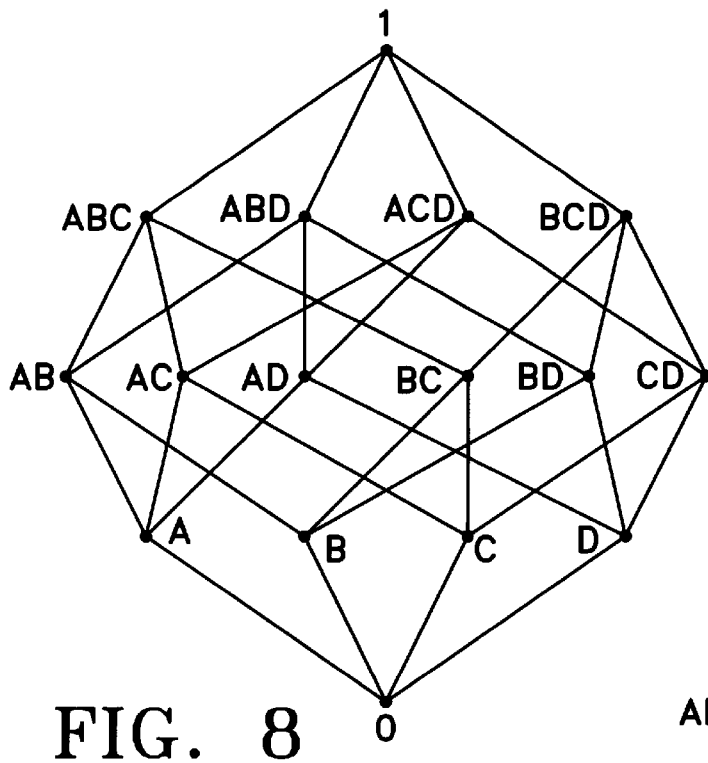
FIG. 8 depicts a more complicated poset model as a Hasse diagram.
Figure 9:
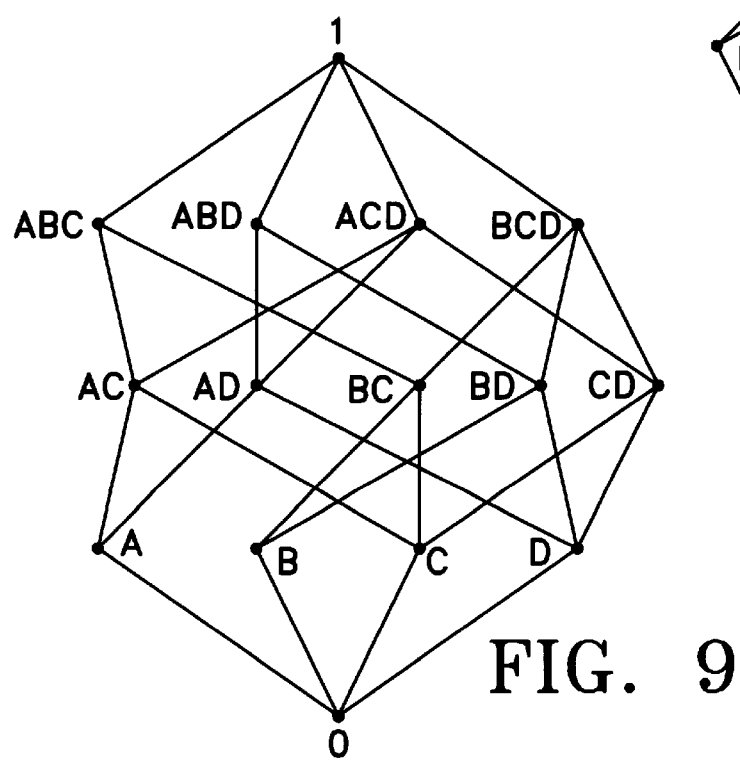
FIG. 9 depicts the poset model of FIG. 8 with a missing state.

For example, let the true model be the poset shown in FIG. 9 and the specified model be the poset shown in FIG. 8. In this situation state AB is superfluous. Suppose the items specified as type AB (if they exist) are really of type {ABC,ABD}, the union of ABC and ABD. Test subjects should then be correctly classified and few will be classified to state AB.

For a second example, suppose that the poset in FIG. 8 is the true model and the one in FIG. 9 is the specified model. The state AB is hidden insofar as the specified model is concerned. Let the items truly of type AB be specified as {ABC,ABD}. Eventually, the mass will be distributed among the states that act as "covers" of AB and those states that are "covered" by AB, i.e. ABC, ABD, A, and B, provided the appropriate item types are administered. If the item pool does not contain an item truly of type AB, test subjects not in AB will be classified without problems. If the test subjects are in AB, again mass will eventually be distributed to the states directly above and below AB, depending on the item selection sequence.

For a third example, when a hidden state from the poset shown in FIG. 8 is a cover of 0 such as A and there are no A-type items, test subjects in state A will most likely be classified to 0. If items truly of type A are present in the test item pool and specified as {AB,AC,AD}, the same phenomenon as in the second example may occur.

Figure 10:
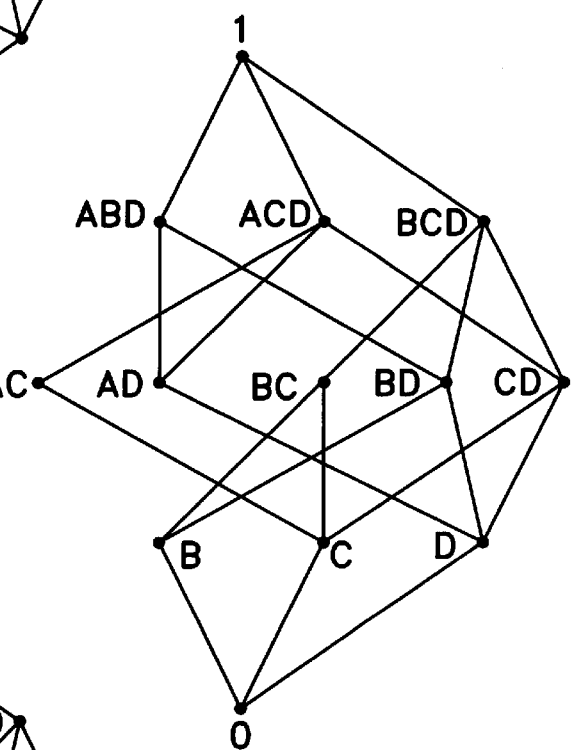
FIG. 10 depicts the poset model of FIG. 8 with many states missing.

For a fourth example, let the poset shown in FIG. 10 be the specified model, again assuming the true model is the poset shown in FIG. 8. With a large missing section as illustrated in FIG. 10, it is more difficult to discover the true model. The conclusions about mass distribution with states missing from the poset can be generalized to apply to specified models having large missing sections. It is necessary to identify what the covers would be for each missing state among the states within the specified model and the states within the specified model that would be covered by each missing state if it were included in the model. Building up large missing sections may require several steps in model fitting.

For a fifth example, assume that a test subject is meandering, i.e. his or her response pattern is erratic involving a series of responses that are contradictory. This situation cannot be explained either by improper type-specification of the test items or by an ill-fitting model.

It follows from the above examples that if items are sharp and correctly specified for the model at hand and if the model is overspecified with too many states, those that are not really valid in a practical sense should have few test subjects classified to them and should be removed from the model. On the other hand, if a state is missing, then classification should in most cases not be strong to any state for test subjects belonging to that missing state.

Erratic response patterns should be carefully examined. A significant number of test subjects sharing similar aberrant patterns (i.e. patterns that do not lead to a dominant posterior value emerging) strengthens the evidence that a state may be missing and should indicate its location in the poset. Test subjects that meander with inconsistent response patterns may need to be eliminated from the trial sample.

The description of the invention has thus far focused on domain models based on discrete posets as exemplified in FIGS. 1, 5, 8, 9, and 10. Domain models can also be based on a combination of a discrete poset and a subset of Euclidean space. In the combination model, test subject states are represented by both a state s in the poset and the value of a continuous parameter t which may be multi-dimensional. For example, the parameter t might correspond to the intelligence quotient of the test subject. A sensible partial order for elements in the combination model would be to let $(s_1,t_1)$ be lower than or equal to $(s_2,t_2)$ if and only if $s_1 \leq s_2$ in the discrete poset and $t_1 \leq t_2$ in the subset of Euclidean space. Items not involving the cognitive or functionality attributes represented by t still partition the discrete component as before. Items involving the attributes represented by t can partition the discrete poset component according to whether the discrete state class conditional densities given a value of t coincide for all values of t. Thus, the mapping to determine separation of the states in the discrete poset component given a pool of test items can be applied in the context of the combination model as well.

The responses for a finite poset model might be distributed discretely or come from a continuous distribution such as a normal distribution. Moreover, the distributions within the same item's partitions may vary. For example, one partition may be multinomially distributed, while the other may be a Bernoulli trial. For combination models, the responses given a state in those models may also be discrete or continuous. Again, distribution types between an item's partitions may be different for the combination model. An example of a continuous response distribution is a normal distribution with mean t and variance $\sigma^2$.

The class conditional densities $f_i$ and $g_i$ for a combination poset-Euclidean space model might be $$f_i(X=1|s,t)=H(t-\alpha_1) \text{ if } e(i) \leq s$$

$$g_i(X=1|s,t)=H(t-\alpha_2) \text{ if } e(i) \not\leq s \tag{25}$$

where $X=1|s,t$ denotes a positive response given s and t and $$H(t) = \frac{pe^t}{1-p+e^t} \tag{26}$$

The parameter p is a known quantity in the range from 0 to 1 and t is real-valued. Note how the distributions associated with the densities $f_i$ and $g_i$ reflect the underlying order structure of the combination model.

The same statistical framework applies as before. The initial SPS (prior distribution) is a probability density function and is given by $$\pi_0(s,t)=\pi_0(t|s)\pi_0(s) \tag{27}$$

where the first term of the product is the conditional probability density value of t given s and the second term is the marginal probability of s.

Posterior distributions $\pi_n(s,t|x_n)$ can be calculated by Bayes rule given response path $x_n$. An example of a loss function for a combination model is $$L(s_0, t_0, d, n) = \begin{cases} A_1(s_0) = K(t - t_0)^2 + \sum_{n=1}^{N} C(i_n); & s = s_0 \\ A_2(s_0) + K(t - t_0)^2 + \sum_{n=1}^{N} C(i_n); & s \neq s_0 \end{cases} \quad (28)$$

where the state d resulting from the application of a particular decision rule is a function of the final $\pi_{n(s,t|x n)}$ and implies the values s and t. The constant K is a scaling parameter greater than 0.

Strategy trees are applicable to combination models as well. Quantities which can provide a computationally simple basis for stopping in the "peel-back" context described above are the posterior variance(s) of t:

$$\sum_s \int (t - u_n(s))^2 \pi_n(t|s) \pi_n(s) dt \quad (29)$$

where the mean of the conditional distribution is given by $$u_n(s) = \int t \pi_n(t|s) dt \quad (30)$$

and the marginal posterior values for s in S are given by $$\pi_n(s) = \int \pi_n(s,t) dt = \int \pi_n(t|s) \pi_n(s) dt \quad (31)$$

Note that the probabilities of test subjects being in partitions of the discrete poset component can be calculated using the marginal posterior values. These probabilities can be used in item selection rules such as in equation (4). Also, the mapping Φ can still be applied on states in S as well as for elements in the combination model, for instance, by employing weighted discrepancy measures on the class conditional densities given values of t.

The equation for $sh_1(\pi_n, i)$ becomes $$sh_1(\pi_n, i) = \int En(\pi_{(n+1)}|X_{(n+1)} = x, It_{(n+1)} = i) P(X_{(n+1)} = x|\pi_n, It_{(n+1)} = i) dx \quad (32)$$

where $$P(X_{(n+1)} = x|\pi_n, It_{(n+1)} = i) = \sum_{s \in S} \int f_i(x|s, t) \pi_n(s, t) dt \quad (33)$$

The equation for $Kg_1(\pi_{n,i})$ becomes $$Kg_1(\pi_n, i) = \quad (34)$$

$$\sum_{s \in S} \int\int |\pi_{(n+1)}(s, t|X_{(n+1)} = x, It_{(n+1)} = i) - \pi_n(s, t)| \cdot f_i(x|s, t) \pi_n(s, t) dx dt$$

where $f_i(x|s,t)$ is the response distribution density value at x of item i given s and t. The quantity $\pi_{(n+1)}(s,t|X_{(n+1)}=x, It_{(n+1)}=i)$ is proportional to $f_i(x|s,t)\pi_n(s,t)$.

The k-step version of the above equation is $$Kg_k(\pi_n, i) = \quad (35)$$

$$\sum_{s \in S} \int\int \left\{ \min_j Kg_{(k-1)}[(\pi_{(n+1)}|X_{(n+1)} = x, It_{(n+1)} = i), j] \right\} \cdot f_i(x|s, t) \pi_n(s) dx dt$$

where "min over j" means the value of the quantity in brackets for an item j from the preceding available item pool which minimizes the value.

In general, all of the item selection, stopping, decision, and updating rules generalize straightforwardly for use with the combination model. Also, fixed tests can be designed, and ideal patterns can be employed.

An important application of the system and of the combination model in particular is in medical diagnosis. The application of the above classification framework and techniques is completely analogous. Items can be viewed as experiments or tests, and the underlying model can represent various conditions related by a partial order structure. For instance, three states can be used to represent a diabetes condition, with one state representing no condition, another state representing Type I diabetes (insulin-dependent), and a third state representing Type II diabetes (non-insulin-dependent). The ordering between these states is natural in relation to the no-condition state, and for the sake of discussion, the states representing Type I and Type II respectively will be assumed to be incomparable. Further, the corresponding class conditional response distributions of experiments such as measuring glucose levels in blood should reflect that ordering, in the sense that the higher the observed responses, the more likely a diabetes condition exists. It is when the response distributions reflect the underlying order structure of the model that the system works most effectively, so that medical applications are well-suited for the system. Of course, it is likely that the class conditional response distributions for the Type I and Type II conditions differ. Other experiments which separate states may be necessary to increase the accuracy in diagnosis. As an example of a multi-dimensional continuous response, an experiment may measure the levels of glucose and ketones together, where ketones are small fragments from the breakdown of fatty acids. The corresponding class conditional densities would then be multivariate. If the levels of glucose and ketones are interrelated, then it may indeed be more informative to measure them together.

Perhaps the diabetes condition or other medical conditions could more appropriately be modeled as a continuous variable within a discrete state such as in a combination model. In general, the poset or combination model can get more complex as various auxiliary conditions are introduced which may or may not be present in conjunction with other conditions, and each of which may have their own natural ordering. Note how the auxiliary conditions may themselves have an effect on experiment responses. This can be modelled by specifying an appropriate partition for an experiment in terms of class conditional densities.

Various types of experiments having a variety of class conditional response distribution types can be administered sequentially which may have different objectives in terms of what they measure. Costs of observation for the experiments can be incorporated into the analysis, as before. Hence, not only can this system be used to conduct actual medical diagnosis, but it can be used to gauge the cost-effectiveness of the experiments. Experiments whose contribution to the classification process do not on average overcome their cost of observation can be identified as they will not be selected with a high weighted frequency and/or probability of administration for instance with respect to SPSs and class conditional densities.

What is claimed is:

1. A method for classifying a test subject in one of a plurality of states in a domain, a domain being a set of facts, a quality measure having a range of values, or a combination of a set of facts and a quality measure, the set of facts for a knowledge domain being any set of facts, the set of facts for a functionality domain being a set of facts relating to the functionality of a test subject, a state being characterized by a subset of facts, a value in the range of values for a quality measure, or a combination of a subset of facts and a value for a quality measure, a first state being higher than or equal to a second state and a second state being lower than or equal to a first state if (1) the subset of facts or the quality measure value associated with the first state respectively includes the subset of facts or is greater than or equal to the quality measure value associated with the second state or (2) the subset of facts and the quality measure value associated with the first state respectively includes the subset of facts and is greater than or equal to the quality measure value associated with the second state, a test subject being classified in the highest state of which he has the knowledge or functionality, the method comprising the steps:

specifying a domain comprising a plurality of states and determining the higher-lower-neither relationships for each state, the higher-lower-neither relationships for a state being a specification of which states are higher, which states are lower, and which states are neither higher or lower, the plurality of states including a first, second, and third fact state characterized by subsets of facts wherein (1) the first and second fact states are higher than the third fact state and the first fact state is neither higher nor lower than the second fact state or (2) the first fact state is higher than the second and third fact states and the second fact state is neither higher nor lower than the third fact state;

specifying a test item pool comprising a plurality of test items, a test item engendering a response when administered to a test subject;

specifying an initial state probability set (SPS) for the test subject to be classified, each member of the initial SPS being an initial estimate of the probability density value that the test subject is associated with a particular state in the domain;

specifying a class conditional density $f_i(x|s)$ for each test item i in the test item pool for each state s in the domain, a class conditional density being a specification of the probability of a test subject in state s providing a response x to the test item i, each item partitioning the domain of states into a plurality of partitions according to the class conditional densities associated with the item, a partition being a subset of states for which the class conditional densities are the same or the union of such subsets;

determining the classification of the test subject.

2. The method of claim 1 wherein the step of determining the classification of the test subject includes the steps:

administering one of a sequence of test items from the test item pool to the test subject;

updating the SPS after receiving a response to the administered test item.

3. The method of claim 2 wherein the (n+1)'th administered test item $i_{(n+1)}$ in the step of administering a sequence of test items is selected from test items in the test item pool that have not already been administered, the test item $i_{(n+1)}$ being the test item which results in a partition for which the probability of a test subject being in the partition is nearest to 0.5.

4. The method of claim 2 wherein the (n+1)'th administered test item $i_{(n+1)}$ in the step of administering a sequence of test items is selected from test items in the test item pool that have not already been administered, $i_{(n+1)}$ being the test item that results in the largest value of a weighted uncertainty measure, the uncertainty measure being a measure of the uncertainty as to which of the test item's partitions that the test subject is in, the uncertainty measure being smallest when all but one of the partition probabilities are near 0, a partition probability being the probability of the test subject being in the partition.

5. The method of claim 2 wherein the (n+1)'th administered test item $i_{(n+1)}$ in the step of administering a sequence of test items is selected from test items in the test item pool that have not already been administered, $i_{(n+1)}$ being the test item that results in the smallest value of a weighted SPS uncertainty measure given the hypothetical administration of $i_{(n+1)}$, an SPS uncertainty measure being a minimum when all but one of the SPS probability density values are near 0.

6. The method of claim 2 wherein the (n+1)'th administered test item $i_{(n+1)}$ in the step of administering a sequence of test items is selected from test items in the test item pool that have not already been administered, $i_{(n+1)}$ being the test item that results in the smallest value of a weighted SPS uncertainty measure given the hypothetical administration of the sequence of test items $i_{(n+1)}, i_{(n+2)}, \ldots, i_{(n+k)}$, k being an integer, an SPS uncertainty measure being a minimum when all but one of the SPS probability density values are near 0.

7. The method of claim 2 wherein the (n+1)'th administered test item $i_{(n+1)}$ in the step of administering a sequence of test items is selected from test items in the test item pool that have not already been administered, $i_{(n+1)}$ being the test item that results in the largest value of a weighted distance measure between the SPS after a hypothetical administration of an (n+1)'th test item and the SPS after the actual administration of the n'th test item, the distance measure being a measure of the differences in the two SPSs.

8. The method of claim 2 wherein the (n+1)'th administered test item $i_{(n+1)}$ in the step of administering a sequence of test items is selected from test items in the test item pool that have not already been administered, $i_{(n+1)}$ being the test item that results in the largest value of a weighted distance measure between the SPS after a hypothetical administration of the sequence of test items $i_{(n+1)}, i_{(n+2)}, \ldots, i_{(n+k)}$, k being an integer, and the SPS after the actual administration of the n'th test item, the distance measure being a measure of the differences in the two SPSs.

9. The method of claim 2 wherein the (n+1)'th administered test item $i_{(n+1)}$ in the step of administering a sequence of test items is selected from test items in the test item pool that have not already been administered, the test item $i_{(n+1)}$ being the test item corresponding to the largest value of a weighted discrepancy measure summed over all pairs of states, a discrepancy measure for a test item given two states being a measure of the distance between the class conditional densities for the item and the two states.

10. The method of claim 9 wherein the (n+1)'th administered test item $i_{(n+1)}$ in the step of administering a sequence of test items is selected from test items in the test item pool that have not already been administered, the test item $i_{(n+1)}$ being selected using a two-valued function $\Phi$, the function $\Phi$ being a function of (1) a test item and (2) a first state and a second state, $\Phi$ having a first value if the test item separates the first and second states, $\Phi$ having a second value if the test item does not separate the first and second states.

11. The method of claim 10 wherein $\Phi$ has a first value for a plurality of the test items for a specified first state and a specified second state, the test item $i_{(n+1)}$ being selected randomly from the plurality of test items.

12. The method of claim 2 wherein test item $i'_{(n+1)}$ is tentatively selected as the (n+1)'th administered test item $i_{(n+1)}$ in the step of administering a sequence of test items, test item $i'_{(n+1)}$ being selected using a predetermined selection rule from test items in the test item pool that have not already been administered, a random decision being made either to use test item $i'_{(n+1)}$ as the (n+1)'th administered test item $i_{(n+1)}$ or to select another test item from the test item pool.

13. The method of claim 12 wherein the test items are ordered according to a goodness criterion associated with the predetermined selection rule, the test item $i'_{(n+1)}$ being the best test item, a plurality of the next-in-order test items being denoted as the better test items, one of the better test items being selected as the (n+1)'th administered test item $i_{(n+1)}$ if the decision is made to select a test item other than test item $i'_{(n+1)}$.

14. The method of claim 13 wherein the selection of one of the better test items is randomly made, the random selection being biased in accordance with the order of the better test items.

15. The method of claim 13 wherein the decision to select a test item other than test item $i'_{(n+1)}$ is made with a probability that is a function of a "temperature" parameter, the probability being a monotonic function of "temperature".

16. The method of claim 2 wherein the (n+1)'th administered test item $i_{(n+1)}$ in the step of administering a sequence of test items is selected from test items in the test item pool that have not already been administered, the test item i(r) being the test item that would be selected using selection rule r, the index r denoting any one of a plurality of selection rules, the test item $i_{(n+1)}$ being the test item i(r) that results in a condition selected from the group of conditions (1) smallest value for a weighted loss function, (2) smallest value for a weighted uncertainty measure, and (3) largest value for a weighted distance measure.

17. The method of claim 2 wherein the (n+1)'th administered test item $i_{(n+1)}$ in the step of administering a sequence of test items is selected from test items in the test item pool that have not already been administered, the test item i(r) being the test item that would be selected using selection rule r, the index r denoting any one of a plurality of selection rules, the test item $i_{(n+1)}$ being a random selection from the test items i(r).

18. The method of claim 2 wherein the (n+1)'th administered test item $i_{(n+1)}$ in the step of administering a sequence of test items is selected from test items in the test item pool that have not already been administered, the test item $i_{(n+1)}$ being the test item that maximizes a weighted relative ranking measure based on a plurality of item selection rules, a weighted relative ranking measure being a weighted function of the relative rankings of attractiveness for each test item with respect to a plurality of item selection rules.

19. The method of claim 2 wherein the (n+1)'th administered test item $i_{(n+1)}$ in the step of administering a sequence of test items is selected from test items in the test item pool that have not already been administered, the test item $i_{(n+1)}$ being the test item corresponding to the largest value of the sum of $\pi_n(j)\pi_n(k)d_{jk}(i)$ over all states j and k in the domain, $\pi_n(j)$ denoting the members of the updated SPS after the test subject has responded to the n'th administered test item, $d_{jk}(i)$ denoting a measure of the degree of discrimination between states j and k provided by test item i as measured by a discrepancy measure on the corresponding class conditional densities.

20. The method of claim 19 wherein $d_{jk}(i)$ is a first function of an integral of a second function over all possible responses to test item i, the second function being the absolute value of the difference in a first class conditional density and a second class conditional density, the first class conditional density being associated with item i and state j and the second class conditional density being associated with item i and state k.

21. The method of claim 20 wherein the first function equals zero when the first and second class conditional densities are the same, the first function being equal to a positive constant when the first and second class conditional densities are different.

22. The method of claim 19 wherein $d_{jk}(i)$ is a first function of an integral of a second function over all possible responses to test item i, the second function being a third function of a difference function, the difference function being the difference between a fourth function of the first class conditional density and the fourth function of the second class conditional density, the first class conditional density being associated with item i and state j and the second class conditional density being associated with item i and state k, the variety of functions denoted by the term "function" including the identity function wherein the function of a quantity is equal to the quantity.

23. The method of claim 19 wherein $d_{jk}(i)$ is a first function of an integral of a second function over all possible responses to test item i, the second function being a function of the ratio of a third function of a first class conditional density and the third function of a second class conditional density weighted by the first class conditional density when the first and second class conditional densities are different, the first class conditional density being associated with item i and state j and the second class conditional density being associated with item i and state k, $d_{jk}(i)$ being equal to zero when the first and second class conditional densities are the same, the variety of functions denoted by the term "function" including the identity function wherein the function of a quantity is equal to the quantity.

24. The method of claim 2 wherein the (n+1)'th administered test item $i_{(n+1)}$ in the step of administering a sequence of test items is selected from test items in the test item pool that have not already been administered, $i_{(n+1)}$ being the test item that results in the smallest value of a weighted loss function for k=1, a loss function being a function of (1) the state in the domain, (2) a classification decision action that specifies a state, and (3) the number k of test items to be administered beginning with $i_{(n+1)}$.

25. The method of claim 2 wherein the (n+1)'th administered test item $i_{(n+1)}$ in the step of administering a sequence of test items is selected from test items in the test item pool that have not already been administered, $i_{(n+1)}$ being the test item that results in the smallest value of a weighted loss function given the hypothetical administration of the sequence of test items $i_{(n+1)}, i_{(n+2)}, \ldots, i_{(n+k)}$, k being an integer, a loss function being a function of (1) the state in the domain, (2) a classification decision action that specifies a state, and (3) the number k of test items to be administered beginning with $i_{(n+1)}$.

26. The method of claim 2 wherein the (n+1)'th administered test item $i_{(n+1)}$ in the step of administering a sequence of test items is selected from test items in the test item pool that have not already been administered, $i_{(n+1)}$ being the test item for which a weighted loss in administering the next k test items is the smallest, the loss in administering k test items being defined by a loss function consisting of two additive components, the first component being a measure of the loss associated with the classification of the test subject after administering the k test items, the loss associated with an incorrect classification being higher than the loss associated with a correct classification, the second component being the cost of administering the k test items.

27. The method of claim 26 wherein the first component of the loss function is (1) a constant $A_1(s)$ if the test subject would be classified correctly after administering k additional test items and (2) a constant $A_2(s)$ if the test subject would be classified incorrectly after administering k additional test items, the constants $A_1(s)$ and $A_2(s)$ having a possible dependence on the state s, the second component of the loss function being the sum of the individual costs of administering the k additional test items.

28. The method of claim 2 wherein the respective responses to test items $i_{(n+1)}, i_{(n+2)}, \ldots, i_{(n+k)}$ are $x_{(n+1)}, x_{(n+2)}, \ldots, x_{(n+k)}$, k being an integer, and the SPS updating rule is a function of the class conditional densities evaluated at $x_{(n+1)}, x_{(n+2)}, \ldots, x_{(n+k)}$ and a given SPS with the SPS probability density value for a state being nondecreasing in the class conditional density value for fixed SPS and fixed class conditional density values for all other states.

29. The method of claim 2 wherein the step of determining the classification of the test subject includes the steps:
   applying a stopping rule, the steps of claim 2 being repeated if the stopping rule does not require that the administering of test items be terminated;
   classifying the test subject as to a state in the domain in accordance with a decision rule if the stopping rule requires that the administering of test items be terminated.

30. The method of claim 29 wherein the domain is a combination model and the stopping rule is to stop administering test items after administering the n'th test item $i_n$ if the marginal posterior value for a state in the discrete component of the domain is greater than a first predetermined value and the posterior variance of the continuous parameter in the domain is less than a second predetermined value.

31. The method of claim 29 wherein the stopping rule is to stop administering test items if a weighted uncertainty measure with respect to the SPS after administration of the n'th test item $i_n$ is less than a predetermined value.

32. The method of claim 29 wherein the stopping rule is to stop administering test items if a weighted distance measure between the initial SPS and the SPS after administration of the n'th test item $i_n$ exceeds a predetermined value.

33. The method of claim 29 wherein the stopping rule is to stop administering test items after administering the n'th test item $i_n$ if a weighted loss function is less than a predetermined value.

34. The method of claim 29 wherein the stopping rule is to stop administering test items if the largest value of the SPS after administration of the n'th test item $i_n$ exceeds a threshold.

35. The method of claim 29 wherein the stopping rule is to stop administering test items if a predetermined number of test items have been administered.

36. The method of claim 29 wherein the stopping rule is to stop administering test items after administering the n'th test item $i_n$ if, given the hypothetical administration of the sequence of one or more test items $i_{(n+1)}, i_{(n+2)}, \ldots, i_{(n+k)}$ where k is an integer, a weighted loss function increases in value.

37. The method of claim 29 wherein the stopping rule is to stop administering test items after administering the n'th test item $i_n$ if, given the hypothetical administration of the sequence of one or more test items $i_{(n+1)}, i_{(n+2)}, \ldots, i_{(n+k)}$ where k is an integer, a weighted uncertainty measure decreases by less than a predetermined value, the weighted uncertainty measure being with respect to the SPS after the administration of item $i_n$ and after the hypothetical administration of the sequence of test items $i_{(n+1)}, i_{(n+2)}, \ldots, i_{(n+k)}$.

38. The method of claim 29 wherein the stopping rule is to stop administering test items after administering the n'th test item $i_n$ if, given the hypothetical administration of the sequence of one or more test items $i_{(n+1)}, i_{(n+2)}, \ldots, i_{(n+k)}$ where k is an integer, a weighted distance measure increases by less than a predetermined value, the weighted distance measure being with respect to the SPS after the administration of item $i_n$ and after the hypothetical administration of the sequence of test items $i_{(n+1)}, i_{(n+2)}, \ldots, i_{(n+k)}$.

39. The method of claim 29 wherein the stopping rule is to stop administering test items after administering the n'th test item $i_n$ if a specified condition occurs, the specified condition being defined in terms of one or more first conditions, one or more second conditions, one or more third conditions, one or more fourth conditions, one or more fifth conditions, one or more sixth conditions, or combinations thereof, a first condition being that a weighted loss function is less than a first predetermined value, a second condition being that a weighted loss function increases in value given the hypothetical administration of one or more test items, a third condition being that a weighted uncertainty measure is less than a second predetermined value, a fourth condition being that a weighted uncertainty measure decreases by less than a third predetermined value given the hypothetical administration of one or more test items, a fifth condition being that a weighted distance measure is larger than a fourth predetermined value, and a sixth condition being that a weighted distance measure increases by less than a predetermined value given the hypothetical administration of one or more test items.

40. The method of claim 29 wherein the decision rule is to select the state associated with the highest value in the SPS.

41. The method of claim 29 wherein the decision rule is to select the state associated with the smallest value for a weighted loss function.

42. The method of claim 1 further comprising the step:
   specifying a strategy tree to be used in administering test items to test subjects, a strategy tree being a plurality of paths, each path beginning with the first test item to be administered, continuing through a sequence alternating between a particular response to the last test item and the specification of the next test item, and ending with a particular response to the final test item in the path, the classification of the test subject being specified for each path of the strategy tree using a decision rule.

43. The method of claim 42 further comprising the step:
   determining for a test item in the test item pool the weighted frequency and/or the probability of being administered.

44. The method of claim 43 further comprising the step:
   removing a test item from the test item pool if the weighted frequency and/or the probability of being administered is less than a predetermined value.

45. The method of claim 42 wherein the (n+1)'th administered test item $i_{(n+1)}$ in the step of specifying a strategy tree is selected from test items in the test item pool that have not already been administered, the test item $i_{(n+1)}$ being the test item which results in a partition for which the probability of a test subject being in the partition is nearest to 0.5.

46. The method of claim 42 wherein the (n+1)'th administered test item $i_{(n+1)}$ in the step of specifying a strategy tree is selected from test items in the test item pool that have not already been administered, $i_{(n+1)}$ being the test item that results in the largest value of a weighted uncertainty measure, the uncertainty measure being a measure of the uncertainty as to which of the test item's partitions that the test subject is in, the uncertainty measure being smallest when all but one of the partition probabilities are near 0, a partition probability being the probability of the test subject being in the partition.

47. The method of claim 42 wherein the (n+1)'th administered test item $i_{(n+1)}$ in the step of specifying a strategy tree is selected from test items in the test item pool that have not already been administered, $i_{(n+1)}$ being the test item that results in the smallest value of a weighted SPS uncertainty measure, given the hypothetical administration of $i_{(n+1)}$, an SPS uncertainty measure being a minimum when all but one of the SPS probability density values are near 0.

48. The method of claim 42 wherein the (n+1)'th administered test item $i_{(n+1)}$ in the step of specifying a strategy tree is selected from test items in the test item pool that have not already been administered, $i_{(n+1)}$ being the test item that results in the smallest value of a weighted SPS uncertainty measure given the hypothetical administration of the sequence of test items $i_{(n+1)}, i_{(n+2)}, \ldots, i_{(n+k)}$, k being an integer, an SPS uncertainty measure being a minimum when all but one of the SPS probability density values are near 0.

49. The method of claim 42 wherein the (n+1)'th administered test item $i_{(n+1)}$ in the step of specifying a strategy tree is selected from test items in the test item pool that have not already been administered, $i_{(n+1)}$ being the test item that results in the largest value of a weighted distance measure between the SPS after a hypothetical administration of an (n+1)'th test item and the SPS after the actual administration of the n'th test item, the distance measure being a measure of the differences in the two SPSs.

50. The method of claim 42 wherein the (n+1)'th administered test item $i_{(n+1)}$ in the step of specifying a strategy tree is selected from test items in the test item pool that have not already been administered, $i_{(n+1)}$ being the test item that results in the largest value of a weighted distance measure between the SPS after a hypothetical administration of the sequence of test items $i_{(n+1)}, i_{(n+2)}, \ldots, i_{(n+k)}$, k being an integer, and the SPS after the actual administration of the n'th test item, the distance measure being a measure of the differences in the two SPSs.

51. The method of claim 42 wherein the (n+1)'th administered test item $i_{(n+1)}$ in the step of specifying a strategy tree is selected from test items in the test item pool that have not already been administered, the test item $i_{(n+1)}$ being the test item corresponding to the largest value of a weighted discrepancy measure summed over all pairs of states, a discrepancy measure for a test item given two states being a measure of the distance between the class conditional densities for the item and the two states.

52. The method of claim 51 wherein the (n+1)'th administered test item $i_{(n+1)}$ in the step of specifying a strategy tree is selected from test items in the test item pool that have not already been administered, the test item $i_{(n+1)}$ being selected using a two-valued function $\Phi$, the function $\Phi$ being a function of (1) a test item and (2) a first state and a second state, $\Phi$ having a first value if the test item separates the first and second states, $\Phi$ having a second value if the test item does not separate the first and second states.

53. The method of claim 52 wherein $\Phi$ has a first value for a plurality of the test items for a specified first state and a specified second state, the test item $i_{(n+1)}$ being selected randomly from the plurality of test items.

54. The method of claim 42 wherein test item $i'_{(n+1)}$ is tentatively selected as the (n+1)'th administered test item $i_{(n+1)}$ in the specifying a strategy tree, test item $i'_{(n+1)}$ being selected using a predetermined selection rule from test items in the test item pool that have not already been administered, a random decision being made either to use test item $i'_{(n+1)}$ as the (n+1)'th administered test item $i_{(n+1)}$ or to select another test item from the test item pool.

55. The method of claim 54 wherein the test items are ordered according to a goodness criterion associated with the predetermined selection rule, the test item $i'_{(n+1)}$ being the best test item, a plurality of the next-in-order test items being denoted as the better test items, one of the better test items being selected as the (n+1)'th administered test item $i_{(n+1)}$ if the decision is made to select a test item other than test item $i'_{(n+1)}$.

56. The method of claim 55 wherein the selection of one of the better test items is randomly made, the random selection being biased in accordance with the order of the better test items.

57. The method of claim 55 wherein the decision to select a test item other than test item $i'_{(n+1)}$ is made with a probability that is a function of a "temperature" parameter, the probability being a monotonic function of "temperature".

58. The method of claim 42 wherein the (n+1)'th administered test item $i_{(n+1)}$ in the step of specifying a strategy tree is selected from test items in the test item pool that have not already been administered, the test item i(r) being the test item that would be selected using selection rule r, the index r denoting any one of a plurality of selection rules, the test item $i_{(n+1)}$ being the test item i(r) that results in a condition selected from the group of conditions (1) smallest value for a weighted loss function, (2) smallest value for a weighted uncertainty measure, and (3) largest value for a weighted distance measure.

59. The method of claim 42 wherein the (n+1)'th administered test item $i_{(n+1)}$ in the step of specifying a strategy tree is selected from test items in the test item pool that have not already been administered, the test item i(r) being the test item that would be selected using selection rule r, the index r denoting any one of a plurality of selection rules, the test item $i_{(n+1)}$ being a random selection from the test items i(r).

60. The method of claim 42 wherein the (n+1)'th administered test item $i_{(n+1)}$ in the step of specifying a strategy tree is selected from test items in the test item pool that have not already been administered, the test item $i_{(n+1)}$ being the test item that maximizes a weighted relative ranking measure based on a plurality of item selection rules, a weighted relative ranking measure being a weighted function of the relative rankings of attractiveness for each test item with respect to a plurality of item selection rules.

61. The method of claim 42 wherein the (n+1)'th administered test item $i_{(n+1)}$ in the step of specifying a strategy tree is selected from test items in the test item pool that have not already been administered, the test item $i_{(n+1)}$ being the test item corresponding to the largest value of the sum of $\pi_n(j)\pi_n(k)d_{jk}(i)$ over all states j and k in the domain, $\pi_n(j)$ denoting the members of the updated SPS after the test subject has responded to the n'th administered test item, $d_{jk}(i)$ denoting a measure of the degree of discrimination between states j and k provided by test item i as measured by a discrepancy measure on the corresponding class conditional densities.

62. The method of claim 61 wherein $d_{jk}(i)$ is a first function of an integral of a second function over all possible responses to test item i, the second function being the absolute value of the difference in a first class conditional density and a second class conditional density, the first class conditional density being associated with item i and state j and the second class conditional density being associated with item i and state k.

63. The method of claim 62 wherein the first function equals zero when the first and second class conditional densities are the same, the first function being equal to a positive constant when the first and second class conditional densities are different.

64. The method of claim 61 wherein $d_{jk}(i)$ is a first function of an integral of a second function over all possible responses to test item i, the second function being a third function of a difference function, the difference function being the difference between a fourth function of the first class conditional density and the fourth function of the second class conditional density, the first class conditional density being associated with item i and state j and the second class conditional density being associated with item i and state k, the variety of functions denoted by the term "function" including the identity function wherein the function of a quantity is equal to the quantity.

65. The method of claim 61 wherein $d_{jk}(i)$ is a first function of an integral of a second function over all possible responses to test item i, the second function being a function of the ratio of a third function of a first class conditional density and the third function of a second class conditional density weighted by the first class conditional density when the first and second class conditional densities are different, the first class conditional density being associated with item i and state j and the second class conditional density being associated with item i and state k, $d_{jk}(i)$ being equal to zero when the first and second class conditional densities are the same, the variety of functions denoted by the term "function" including the identity function wherein the function of a quantity is equal to the quantity.

66. The method of claim 42 wherein the (n+1)'th administered test item $i_{(n+1)}$ in the step of specifying a strategy tree is selected from test items in the test item pool that have not already been administered, $i_{(n+1)}$ being the test item that results in the smallest value of a weighted loss function given the hypothetical administration of the sequence of test items $i_{(n+1)}, i_{(n+2)}, \ldots, i_{(n+k)}$, k being an integer, a loss function being a function of (1) the state in the domain, (2) a classification decision action that specifies a state, and (3) the number k of test items to be administered beginning with $i_{(n+1)}$.

67. The method of claim 42 wherein the (n+1)'th administered test item $i_{(n+1)}$ in the step of specifying a strategy tree is selected from test items in the test item pool that have not already been administered, $i_{(n+1)}$ being the test item that results in the smallest value of a weighted loss function for k=1, a loss function being a function of (1) the state in the domain, (2) a classification decision action that specifies a state, and (3) the number k of test items to be administered beginning with $i_{(n+1)}$.

68. The method of claim 42 wherein the (n+1)'th administered test item $i_{(n+1)}$ in the step of specifying a strategy tree is selected from test items in the test item pool that have not already been administered, $i_{(n+1)}$ being the test item for which the weighted loss in administering the next k test items is the smallest, the loss in administering k test items being defined by a loss function consisting of two additive components, the first component being a measure of the loss associated with the classification of the test subject after administering the k test items, the loss associated with an incorrect classification being higher than the loss associated with a correct classification, the second component being the cost of administering the k test items.

69. The method of claim 68 wherein the first component of the loss function is (1) a constant $A_1(s)$ if the test subject would be classified correctly after administering k additional test items and (2) a constant $A_2(s)$ if the test subject would be classified incorrectly after administering k additional test items, the constants $A_1(s)$ and $A_2(s)$ having a possible dependence on the state s, the second component of the loss function being the sum of the individual costs of administering the k additional test items.

70. The method of claim 42 wherein in the step of specifying a strategy tree a stopping rule is applied after each specification of a test item in the strategy tree, an additional test item being specified only if the stopping rule so specifies.

71. The method of claim 70 wherein the domain is a combination model and the stopping rule is to stop administering test items after administering the n'th test item $i_n$ if the marginal posterior value for a state in the discrete component of the domain is greater than a first predetermined value and the posterior variance of the continuous parameter in the domain is less than a second predetermined value.

72. The method of claim 70 wherein the stopping rule is to stop specifying test items if the largest value of the SPS after administration of the n'th test item $i_n$ exceeds a threshold.

73. The method of claim 70 wherein the stopping rule is to stop specifying test items if a predetermined number of test items have been specified.

74. The method of claim 70 wherein the stopping rule is to stop administering test items if a weighted uncertainty measure with respect to the SPS after administration of the n'th test item $i_n$ is less than a predetermined value.

75. The method of claim 70 wherein the stopping rule is to stop administering test items if a weighted distance measure between the initial SPS and the SPS after administration of the n'th test item $i_n$ exceeds a predetermined value.

76. The method of claim 70 wherein the stopping rule is to stop administering test items after administering the n'th test item $i_n$ if a weighted loss function is less than a predetermined value.

77. The method of claim 70 wherein the stopping rule is to stop administering test items after administering the n'th test item $i_n$ if, given the hypothetical administration of the sequence of test items $i_{(n+1)}, i_{(n+2)}, \ldots, i_{(n+k)}$ where k is an integer, a weighted loss function increases in value.

78. The method of claim 70 wherein the stopping rule is to stop administering test items after administering the n'th test item $i_n$ if, given the hypothetical administration of the sequence of test items $i_{(n+1)}, i_{(n+2)}, \ldots, i_{(n+k)}$ where k is an integer, a weighted uncertainty measure decreases by less than a predetermined value, the weighted uncertainty measure being with respect to the SPS after the administration of item $i_n$ and after the hypothetical administration of the sequence of test items $i_{(n+1)}, i_{(n+2)}, \ldots, i_{(n+k)}$.

79. The method of claim 70 wherein the stopping rule is to stop administering test items after administering the n'th test item $i_n$ if, given the hypothetical administration of the sequence of test items $i_{(n+1)}, i_{(n+2)}, \ldots, i_{(n+k)}$ where k is an integer, a weighted distance measure increases by less than a predetermined value, the weighted distance measure being with respect to the SPS after the administration of item $i_n$ and after the hypothetical administration of the sequence of test items $i_{(n+1)}, i_{(n+2)}, \ldots, i_{(n+k)}$.

80. The method of claim 70 wherein the stopping rule is to stop administering test items after administering the n'th test item $i_n$ if, given the hypothetical administration of the sequence of one or more test items $i_{(n+1)}, i_{(n+2)}, \ldots, i_{(n+k)}$ where k is an integer, if a specified criterion is satisfied, the specified criterion being defined in terms of one or more first conditions, one or more second conditions, one or more third conditions, or combinations thereof, a first condition being that a weighted loss function increases in value, a second condition being that a weighted uncertainty measure decreases by less than a specified predetermined value, and a third condition being that a weighted distance measure increases by less than a specified predetermined value, the weighted uncertainty measure and the weighted distance measure being with respect to the SPS after the administration of item $i_n$ and after the hypothetical administration of the sequence of test items $i_{(n+1)}, i_{(n+2)}, \ldots, i_{(n+k)}$.

81. The method of claim 42 wherein one or more test items at the ends of a specified strategy tree are removed if the weighted loss in administering test items for the resulting strategy tree is less than the weighted loss for the specified strategy tree, the weighted loss being obtained by weighting a loss function over all paths in the strategy tree and all test subject states, the loss function being a measure of the loss associated with administering the test items in a path of the strategy tree.

82. The method of claim 81 wherein the loss function is a function of (1) the state of the domain, (2) a classification decision action that specifies a state, and (3) the number of items administered.

83. The method of claim 81 wherein the loss function consists of two additive components, the first component being a measure of the loss associated with the classification of the test subject after administering the k test items, the loss associated with an incorrect classification being higher than the loss associated with a correct classification, the second component being the cost of administering the k test items.

84. The method of claim 83 wherein the first component of the loss function is (1) a constant $A_1(s)$ if the test subject would be classified correctly after administering k additional test items and (2) a constant $A_2(s)$ if the test subject would be classified incorrectly after administering k additional test items, the constants $A_1(s)$ and $A_2(s)$ having a possible dependence on the state s, the second component of the loss function being the sum of the individual costs of administering the k additional test items.

85. The method of claim 42 wherein the decision rule is to select the state associated with the highest value in the SPS.

86. The method of claim 42 wherein the decision rule is to select the state associated with the smallest value for a weighted loss function.

87. The method of claim 42 wherein the step of determining the classification of the test subject includes the step:
administering test items to a test subject in accordance with the strategy tree;
classifying the test subject in accordance with the path followed by the test subject through the strategy tree.

88. The method of claim 1 wherein the domain specifying step comprises the steps:
specifying at least one initial model of the states in the domain;
administering the test items in the test item pool to a plurality of test subjects,
classifying each test subject as to state for each initial model;
identifying superfluous states in each model and eliminating them from the model;
identifying missing states in each model and adding them to the model.

89. The method of claim 1 wherein the test-item-pool-specifying step comprises the steps:
specifying at least one initial model of the states in the domain;
administering the test items in the test item pool to a plurality of test subjects,
determining for a test item in the test item pool the weighted frequency and/or probability that the test item is administered;
removing the test item if the weighted frequency and/or probability is less than a predetermined value.

90. The method of claim 1 wherein the domain specifying step comprises the steps:
specifying at least one initial model of the states in the domain;
administering a sequence of test items from the test item pool to each of one or more test subjects, the corresponding sequence of responses obtained for each of the test subjects being called a test subject response pattern;
determining the ideal response pattern for a test subject in each of one or more domain states for each administered sequence of test items using the class conditional densities associated with each test item, an ideal response being a value or a set of values;
identifying those ideal response patterns that do not satisfy a specified criterion with respect to each test subject response pattern, the specified criterion being specified in terms of one or more distance measures, a distance measure being a measure of the differences between a test subject response pattern and an ideal response pattern.

91. The method of claim 90 wherein a state is removed from the initial model if its corresponding ideal response pattern does not satisfy the specified criterion with respect to a specified number of test subject patterns.

92. The method of claim 90 wherein one or more states is added to the initial model if a specified number of ideal response patterns do not satisfy the specified criterion with respect to one or more test subject response patterns.

93. The method of claim 1 wherein the test-item-pool specifying step comprises the steps:
determining the intersections of the partitions of states by the test items in the test item pool.

94. The method of claim 93 wherein the test-item-pool specifying step includes the step:
adding new types of test items to the test item pool to reduce multi-state intersections to single-state intersections.

95. The method of claim 1 wherein the domain-specifying step comprises the steps:
determining the intersections of the partitions of states by the test items in the test item pool;
replacing the original domain model with a new domain model with new states, the new states being the intersections of the partitions of the original states by the test items, the higher-lower-neither relationships of the new states being derived from the higher-lower-neither relationships of the original states.

96. The method of claim 1 wherein the class-conditional-density-specifying step comprises the steps:
(a) specifying prior distribution functions for the parameters of each test item and state, the class conditional densities for the test items being determinable from the item parameter distribution functions;
(b) administering a sequence of test items from the test item pool to each of a plurality of test subjects and recording the sequence of responses;
(c) updating the SPS for each response in the sequence of responses using the initial SPS and the test item class conditional densities;

(d) determining the test subject's classification;
(e) updating the distribution functions for the parameters of each test item and state utilizing each test subject's classification;
(f) repeating steps (c), (d), (e), and (f) until the process converges.

97. The method of claim 1 wherein the test-item-pool-specifying step comprises the steps:

determining the sharpness of a test item from the test item pool, sharpness being a measure of the capability of a test item to discriminate between test subjects in different states, sharpness being measured by use of one or more discrepancy measures;

removing the test item from the pool if its sharpness does not satisfy a predetermined criterion.

98. The method of claim 1 wherein the class-conditional-density-specifying step comprises the steps:

identifying test items having questionable class conditional densities, a questionable class conditional density being indicated by a sharpness criterion not being satisfied;

changing the class conditional probability density of one or more test items to achieve greater sharpness.

99. The method of claim 98 wherein the class-conditional-density-specifying step further comprises the steps:

removing from the test item pool any test items for which the class conditional densities were changed and the sharpness criterion was not satisfied.

100. The method of claim 1 further comprising the step:

specifying a remediation program for each state in the domain, a remediation program for state X being a compilation of facts associated with one or more other states in the domain and a procedure for teaching the facts in the compilation to a test subject, the compilation not including facts associated with state X.

101. The method of claim 1 wherein the step of determining the classification of the test subject includes the steps:

(a) administering one of a sequence of test items from the test item pool to the test subject;
(b) updating the SPS after receiving a response to the administered test item;
(c) applying a stopping rule, steps (a) and (b) being repeated if the stopping rule so specifies;
(d) classifying the test subject as to a state in the domain in accordance with a classification rule if the stopping rule so specifies;
(e) directing the test subject to a remediation program.

* * * * *